United States Patent
Takita et al.

(10) Patent No.: US 7,587,703 B2
(45) Date of Patent: Sep. 8, 2009

(54) LAYOUT DETERMINATION METHOD, METHOD OF MANUFACTURING SEMICONDUCTOR DEVICES, AND COMPUTER READABLE PROGRAM

(75) Inventors: Hiroshi Takita, Kawasaki (JP); Takashi Maruyama, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 461 days.

(21) Appl. No.: 11/509,617

(22) Filed: Aug. 25, 2006

(65) Prior Publication Data

US 2007/0226672 A1 Sep. 27, 2007

(30) Foreign Application Priority Data

Mar. 23, 2006 (JP) .............................. 2006-080576

(51) Int. Cl.
*G06F 17/50* (2006.01)
(52) U.S. Cl. ............................... 716/21; 716/11; 716/19
(58) Field of Classification Search ...................... 716/1, 716/19, 21, 11
See application file for complete search history.

(56) References Cited

U.S. PATENT DOCUMENTS

| | | | | |
|---|---|---|---|---|
| 5,334,845 A | * | 8/1994 | Wakabayashi et al. | ... 250/492.2 |
| 5,337,247 A | * | 8/1994 | Hamaguchi | .................. 700/121 |
| 5,874,189 A | * | 2/1999 | Stroh et al. | .................... 430/22 |
| 6,268,090 B1 | * | 7/2001 | Matsubara et al. | .............. 430/5 |
| 6,314,548 B1 | * | 11/2001 | Suzuki | ......................... 716/11 |
| 6,507,944 B1 | * | 1/2003 | Kikuchi et al. | ................. 716/21 |
| 6,892,375 B2 | * | 5/2005 | Kimura | ........................ 716/21 |
| 7,205,078 B2 | * | 4/2007 | Osawa et al. | ................... 430/30 |

FOREIGN PATENT DOCUMENTS

JP 2005-268611 9/2005

* cited by examiner

*Primary Examiner*—Sun J Lin
(74) *Attorney, Agent, or Firm*—Staas & Halsey LLP

(57) ABSTRACT

A layout determination method determines a layout of semiconductor devices that are to be created on a substrate by carrying out an exposure process. The layout determination method determines a number of semiconductor devices to be created on one substrate, based on exposure data of the semiconductor devices, a time limit of delivery of the semiconductor devices and a number of substrates to be used for production of the semiconductor devices, obtains coordinates of semiconductor devices arrangeable on the substrate, based on the exposure data, and determines the layout of the semiconductor devices to be created on the substrate, based on the exposure data, the number of semiconductor devices and the coordinates of the semiconductor devices.

24 Claims, 21 Drawing Sheets

FIG.1A
FIG.1B
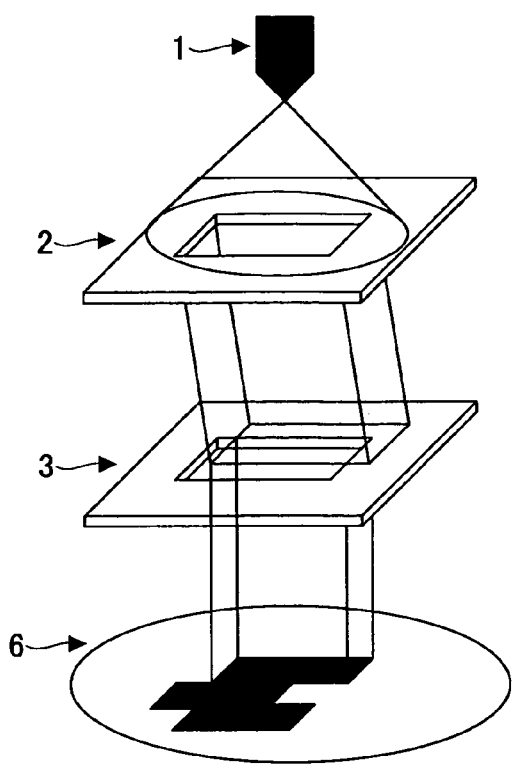
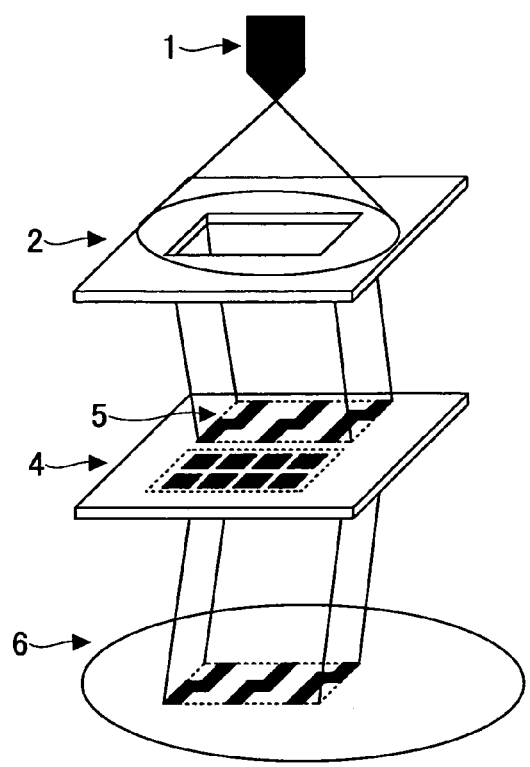

| | |
|---|---|
| | NO. OF ARRANGEMENT POSITIONS (N) |
| 1 | ARRANGEMENT FLAG (F) |
| | COORDINATE (X) |
| | COORDINATE (Y) |
| 2 | ARRANGEMENT FLAG (F) |
| | COORDINATE (X) |
| | COORDINATE (Y) |
| 3 | ARRANGEMENT FLAG (F) |
| | COORDINATE (X) |
| | COORDINATE (Y) |
| ⋮ | ⋮ |
| N | ARRANGEMENT FLAG (F) |
| | COORDINATE (X) |
| | COORDINATE (Y) |

| TOTAL WORD NO. |
| --- |
| SEMICONDUCTOR DEVICE NO. |
| NO. OF SEMICONDUCTOR DEVICES TO BE PRODUCED (M) |
| WAFER SIZE |
| SEMICONDUCTOR DEVICE SIZE (X) |
| SEMICONDUCTOR DEVICE SIZE (Y) |

1
| COORDINATE (X) |
| --- |
| COORDINATE (Y) |

2
| COORDINATE (X) |
| --- |
| COORDINATE (Y) |

3
| COORDINATE (X) |
| --- |
| COORDINATE (Y) |

⋮

M
| COORDINATE (X) |
| --- |
| COORDINATE (Y) |

LAYOUT DETERMINATION METHOD, METHOD OF MANUFACTURING SEMICONDUCTOR DEVICES, AND COMPUTER READABLE PROGRAM

BACKGROUND OF THE INVENTION

1. Field of the Invention

The present invention generally relates to layout determination methods, methods of manufacturing semiconductor devices, and computer-readable programs, and more particularly to a layout determination method for determining a layout when producing a semiconductor device by exposing patterns by an electron beam, a method of manufacturing semiconductor devices using such a layout determination method, and a computer-readable program for causing a computer to execute such a layout determination method or method of manufacturing the semiconductor device. The present invention also relates to a computer-readable storage medium which stores such a computer-readable program.

2. Description of the Related Art

[Electron Beam Exposure Apparatus]

In an exposure process of the method of producing the semiconductor device, patterns are transferred on a resist that is coated on a wafer. The electron beam exposure can transfer extremely fine patterns when compared to the exposure using ultraviolet light, and has been developed as the exposure method for the next generation.

FIGS. 1A and 1B are diagrams showing examples of the electron beam exposure apparatus. FIG. 1A shows a case where a variable rectangle exposure is carried out, and FIG. 1B shows a case where a one-shot exposure is carried out.

An electron beam emitted from an electron gun 1 is formed into a square shape having a side of 5 μm, for example, by a first aperture 2. As shown in FIG. 1A, in the case of the variable rectangle exposure which exposes the patterns one pattern at a time, the electron beam that is shaped by the first aperture 2 is shaped into an arbitrary size by a second aperture 3, so as to expose the pattern on a wafer 6.

As shown in FIG. 1B, in the case of the one-shot exposure, a mask (hereinafter referred to as a block mask) 4 which can accommodate a pattern group (hereinafter referred to as a block) for exposing 100 to 400 kinds of patterns in one-shot, for example, is set at the second aperture, so as to irradiate the electron beam that is shaped by the first aperture 2 at a block arranging position 5 of the block mask 4. For example, apertures having the shape of patterns that are enlarged to 25 to 60 times the size of the finally exposed patterns are formed at the block arranging position 5, and the patterns are exposed on the wafer 6 by the electron beam that is shaped by these apertures.

The one-shot exposure requires a smaller number of shots when compared to the variable rectangle exposure, and can therefore improve the throughput of the semiconductor device production. In addition, since it takes approximately 2 weeks to complete the block mask 4 when an order is placed to a mask manufacturer to create the block mask 4, the block mask 4 is not created for each semiconductor device, and a common block mask is create for each technology according to the width (nm) of the transistor gate layer, such as the 95 nm technology and the 65 nm technology. In other words, when using the block mask for the 90 nm technology, for example, the exposure processes of all semiconductor devices are carried out using this block mask as a common block mask. The block mask accommodates blocks of RAMs, ROMs, input and output (I/O) parts and the like.

[Exposure Data Processing]

In the exposure data processing that processes the exposure data used when carrying out the electron beam exposure, design data storing patterns of semiconductor devices are converted into the exposure data. The exposure data stores variable rectangle exposure patterns, blocks and the like. The electron beam exposure apparatus reads the exposure data, and converts the exposure data into a format suited for the exposure. In addition, the exposure data is created for each layer of the semiconductor device to be exposed, such as the wiring layer and the via layer.

[Layout And Exposure Sequence]

FIG. 2 is a diagram showing an example of the layout of the semiconductor devices on the wafer 6. As shown in FIG. 2, a plurality of semiconductor devices 11 are arranged on the wafer 6. Each semiconductor device 11 has a size 12 in an X-direction and a size 13 in a Y-direction.

For example, the layout specification of the semiconductor devices 11 is determined for each wafer size, and one semiconductor devices 11 is arranged by matching its center to a center 14 of the wafer 16, and arranging one column of semiconductor devices 11 along the Y-direction by matching centers thereof to a dotted line 15. Next, columns of semiconductor devices 11 are similarly arranged by matching centers thereof to corresponding dotted lines 16 through 20, on the right side of the center 14 of the wafer 6. In addition, the semiconductor devices 11 are similarly arranged on the left side of the center 14 of the wafer 6. A size 21 in the X-axis direction is a value obtained by adding a size of 50 μm, for example, due to dicing or the like to the size 12 in the X-direction of the semiconductor device 11. Similarly, a size 22 in the Y-axis direction is a value obtained by adding a size of 50 μm, for example, due to dicing or the like to the size 13 in the Y-direction of the semiconductor device 11. If the semiconductor device 11 in its entirety cannot be accommodated within the wafer 5, the semiconductor devices 11 indicated by the hatching in FIG. 2, for example, are not exposed, and the semiconductor devices 11 indicated by the hatching are actually not produced.

FIGS. 3A and 3B are diagrams for explaining the exposure sequence of the semiconductor devices 11. A range (hereinafter referred to as a field) in which the electron beam can be irradiated is set in the electron beam exposure apparatus, and for example, the semiconductor devices 11 are sectioned into fields having sizes 25 as shown in FIG. 3A. The exposure is carried out in a sequence indicated by an arrow 23 in FIG. 3B, from the bottom to top of the field size 25 and from the top to bottom of the field size 25. More particularly, the electron beam exposure apparatus moves a based on which the wafer 6 is placed, so as to carry out the exposure in the sequence indicated by the arrow 23 in FIG. 2. When the exposure folds back (or switches back) along the moving direction, the adjustment of the moving speed and the positioning (or alignment) to carry out the exposure at the correction position are made, and thus, the exposure is not carried out for a predetermined time.

[Wafer Process]

A wafer process refers to the process of creating the semiconductor devices on the wafer 6, and can mainly be categorized into a process of forming transistors (hereinafter referred to as a substrate process) and a process of forming wirings (hereinafter referred to as a wiring process).

More particularly, basic processes such as exposing, developing, etching, cleaning, thermal process, ion implantation, thin film formation, and planarization of interlayer insulator are carried out. For example, a plurality of wiring layers and via layers are formed in the wiring process, and a plurality of basic processes are carried out for each of the wiring layers and via layers. The numbers of wiring layers and via layers respectively are 5 to 8, for example, and there are 10 to 16 wiring layers and via layers in total, for example. Accordingly, the total number of basic processes becomes 100 or greater, for example.

A Japanese Laid-Open Patent Application No. 2005-268611 proposes a method of producing a semiconductor device, in which conditions and evaluation data to be used after a preprocessing of a sample wafer are created before the preprocessing.

For example, when creating semiconductor devices having a width and a height that are both 10 mm on a wafer having a radius of 300 mm, approximately 700 semiconductor devices may be arranged on the wafer. If the number of shots for one wiring layer is 100 M, the number of shots for the entire wafer becomes 70 G, and it takes 12 hours or more for the exposure according to the capability of the existing electron beam exposure apparatus. For this reason, if the time limit of delivery from the time of order of the semiconductor devices, it is difficult to produce the semiconductor devices to meet the time limit of delivery. Normally, before the semiconductor devices are mass produced, semiconductor devices for which the reliability is not guaranteed are forwarded to the customer as engineering samples (ESs), but normally, the time limit of delivery of such engineering samples is relatively short from the time of order.

In addition, if the wafer having the radius of 200 mm is used, the number of semiconductor devices having the same size that may be arranged on the wafer is approximately 300, and the exposure time is approximately 6 hours. But presently, the semiconductor devices subsequent to the 90 nm technology are produced on a production line exclusively for the wafer having the radius of 300 mm, and the wafer having the radius of 200 mm cannot be used on the production line exclusively for the wafer having the radius of 300 mm. In other words, in order to use the wafer having the radius of 200 mm, it is necessary to set up a production line exclusively for the wafer having the radius of 200 mm. Therefore, in the environment in which the production line exclusively for the wafer having the radius of 300 mm is set up, it is impossible to use the wafer having the radius of 200 mm so as to meet the time limit of delivery of the engineering samples, for example.

SUMMARY OF THE INVENTION

Accordingly, it is a general object of the present invention to provide a novel and useful layout determination method, method of manufacturing semiconductor devices, computer-readable program, and computer-readable storage medium, in which the problems described above are suppressed.

Another and more specific object of the present invention is to provide a layout determination method, a method of manufacturing semiconductor devices, a computer-readable program, and a computer-readable storage medium, which enable semiconductor devices to be produced to positively meet a time limit of delivery.

Still another object of the present invention is to provide a layout determination method for determining a layout of semiconductor devices that are to be created on a substrate by carrying out an exposure process, comprising determining a number of semiconductor devices to be created on one substrate, based on exposure data of the semiconductor devices, a time limit of delivery of the semiconductor devices and a number of substrates to be used for production of the semiconductor devices; obtaining coordinates of semiconductor devices arrangeable on the substrate, based on the exposure data; and determining the layout of the semiconductor devices to be created on the substrate, based on the exposure data, the number of semiconductor devices and the coordinates of the semiconductor devices. According to the layout determination method of the present invention, it is possible to enable semiconductor devices to be produced to positively meet a time limit of delivery.

A further object of the present invention is to provide a method of manufacturing semiconductor devices, comprising determining a number of semiconductor devices to be created on one substrate, based on exposure data of semiconductor devices, time limit of delivery of the semiconductor devices and a number of substrates used for production of the semiconductor devices; obtaining coordinates of semiconductor devices arrangeable on the substrate, based on the exposure data; determining a layout of the semiconductor devices to be created on the substrate, based on the exposure data, the number of semiconductor devices and the coordinates of the semiconductor devices; and exposing patterns of the exposure data on the substrate, based on the layout. According to the method of manufacturing semiconductor devices of the present invention, it is possible to enable semiconductor devices to be produced to positively meet a time limit of delivery.

Another object of the present invention is to provide a computer-readable program for causing a computer to determine a layout of semiconductor devices that are to be created on a substrate by carrying out an exposure process, the program comprising a number determining procedure causing the computer to determine a number of semiconductor devices to be created on one substrate, based on exposure data of the semiconductor devices, a time limit of delivery of the semiconductor devices and a number of substrates to be used for production of the semiconductor devices; an obtaining procedure causing the computer to obtain coordinates of semiconductor devices arrangeable on the substrate, based on the exposure data; and a layout determining procedure causing the computer to determine the layout of the semiconductor devices to be created on the substrate, based on the exposure data, the number of semiconductor devices and the coordinates of the semiconductor devices. According to the computer-readable program of the present invention, it is possible to enable semiconductor devices to be produced to positively meet a time limit of delivery.

Still another object of the present invention is to provide a computer-readable program for causing a computer to manufacture semiconductor devices, the program comprising a number determining procedure causing the computer to determine a number of semiconductor devices to be created on one substrate, based on exposure data of semiconductor devices, time limit of delivery of the semiconductor devices and a number of substrates used for production of the semiconductor devices; an obtaining procedure causing the computer to obtain coordinates of semiconductor devices arrangeable on the substrate, based on the exposure data; a layout determining procedure causing the computer to determine a layout of the semiconductor devices to be created on the substrate, based on the exposure data, the number of semiconductor devices and the coordinates of the semiconductor devices; and an exposing procedure causing the computer to expose patterns of the exposure data on the substrate, based on the layout. According to the computer-readable program of the present invention, it is possible to enable semiconductor devices to be produced to positively meet a time limit of delivery.

Other objects and further features of the present invention will be apparent from the following detailed description when read in conjunction with the accompanying drawings.

BRIEF DESCRIPTION OF THE DRAWINGS

FIGS. 1A and 1B are diagrams showing examples of an electron beam exposure apparatus;

FIG. 9 is a diagram showing an example of an intermediate table;

FIG. 12 is a diagram showing an example of a semiconductor device arrangement coordinate table;

DESCRIPTION OF THE PREFERRED EMBODIMENTS

In the present invention, when producing semiconductor devices by exposing patterns on a substrate such as a wafer using a charged particle beam such as an electron beam, design data of the semiconductor devices are converted into exposure data, and the number of semiconductor devices to be created on the wafer is determined so as to meet a time limit of delivery. In addition, the arrangement (that is, the layout) of the semiconductor devices on the wafer is determined for the determined number of semiconductor devices to be created, and patterns are exposed on the wafer according to the determined layout of the semiconductor devices.

According to the present invention, the number of semiconductor devices, determined to meet the time limit of delivery, are created on the wafer having a radius of 300 mm, for example, and it will not take 12 hours or more for the exposure. Moreover, since the number of engineering samples that are required is normally in a range of several to several tens of samples, it is sufficient to set one wafer in a production line, regardless of whether a wafer having a radius of 200 mm is used or the wafer having the radius of 300 mm is used.

Accordingly, by applying the present invention to the production of the engineering samples, it is possible to produce the engineering samples without creating an expensive reticle that is required for the exposure using ultraviolet light, and it is possible to greatly suppress the development costs of the semiconductor devices.

Furthermore, when a customer inspects an operation speed, a power consumption and the like of the engineering samples and it is found from the inspection that the engineering samples do not satisfy design specifications, it is necessary to modify the design data and recreate the engineering samples. Such a recreation request for the engineering samples occur relatively often, and the effects of the present invention which enables the engineering samples to be produced to positively meet the time limit of delivery are large.

Next, a description will be given of each embodiment of a layout determination method, a method of manufacturing semiconductor devices, a computer-readable program and a computer-readable storage medium according to the present invention, by referring to FIG. 4 and the subsequent figures.

First Embodiment

Figure 4:
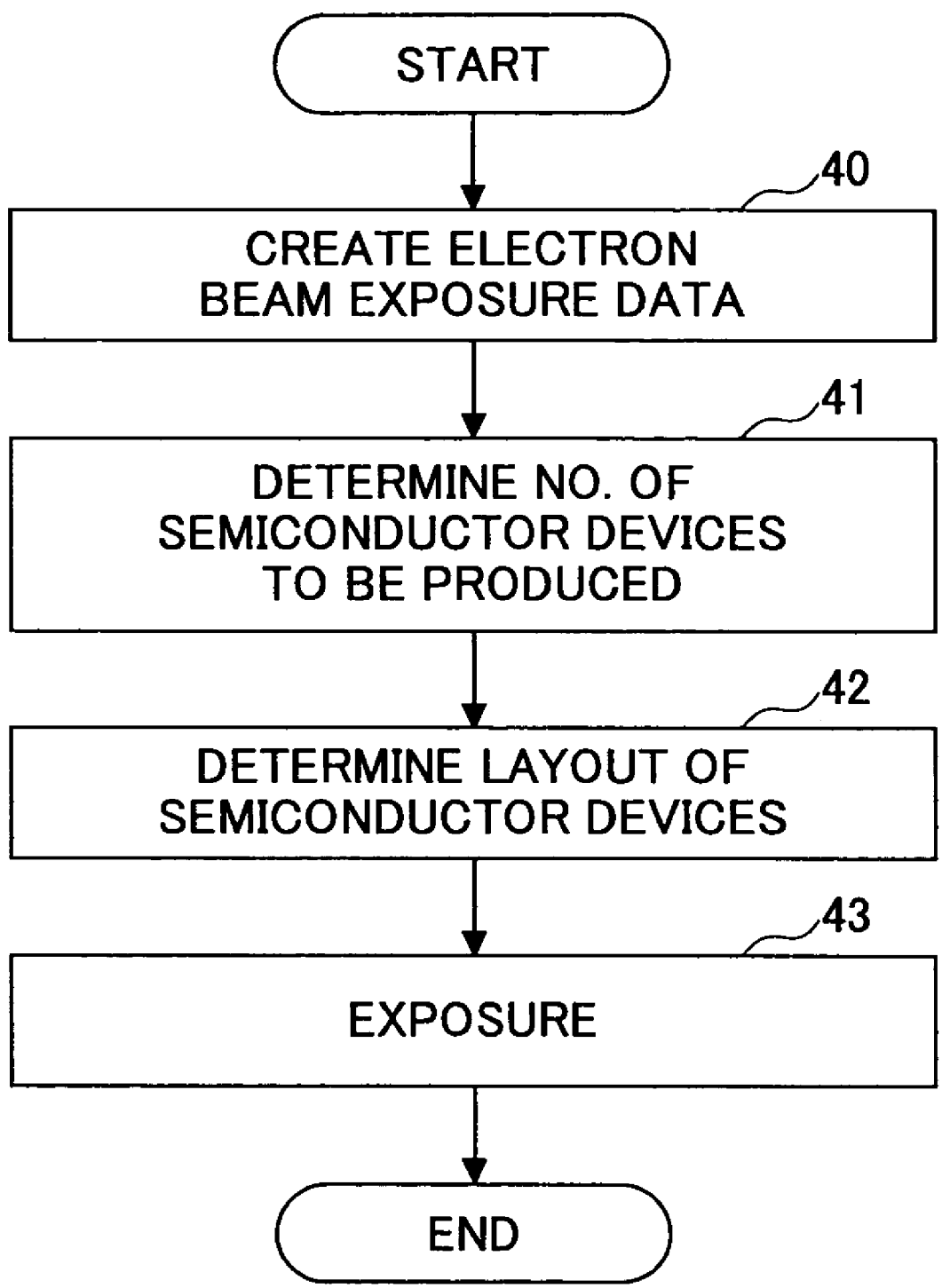
FIG. 4 is a flow chart for explaining a first embodiment of the method of manufacturing semiconductor devices according to the present invention.

FIG. 4 is a flow chart for explaining a first embodiment of the method of manufacturing the semiconductor devices according to the present invention. This first embodiment of the method of manufacturing the semiconductor devices employs a first embodiment of the layout determination method according to the present invention. A first embodiment of the computer-readable program according to the present invention causes a computer to execute the first embodiment of the layout determination method or the method of manufacturing the semiconductor devices. The computer-readable program is executable on a known general-purpose computer having a processor such as a CPU and a storage part. A first embodiment of the computer-readable storage medium according to the present invention stores this first embodiment of the computer-readable program. The computer-readable storage medium may be formed by any suitable recording medium capable of storing the computer-readable program in a computer-readable manner, including magnetic recording media, optical recording media, magneto-optical recording media and semiconductor memory devices.

In FIG. 4, a step 40 carries out an exposure data creating process to create exposure data used for creating semiconductor devices on a wafer by electron beam exposure. It is assumed for the sake of convenience that the semiconductor devices that are created on the wafer are identical or, of the same kind (or type). A step 41 carries out a producing number determination process to determine the number of semiconductor devices to be created on the wafer. A step 42 carries out a layout determination process to determine a layout of the semiconductor devices on the wafer. A step 43 carries out an exposure process to expose patterns of the semiconductor devices on the wafer, based on the created exposure data, the determined number of semiconductor devices and the determined layout of the semiconductor devices.

[Exposure Data Creating Process]

Figure 5:
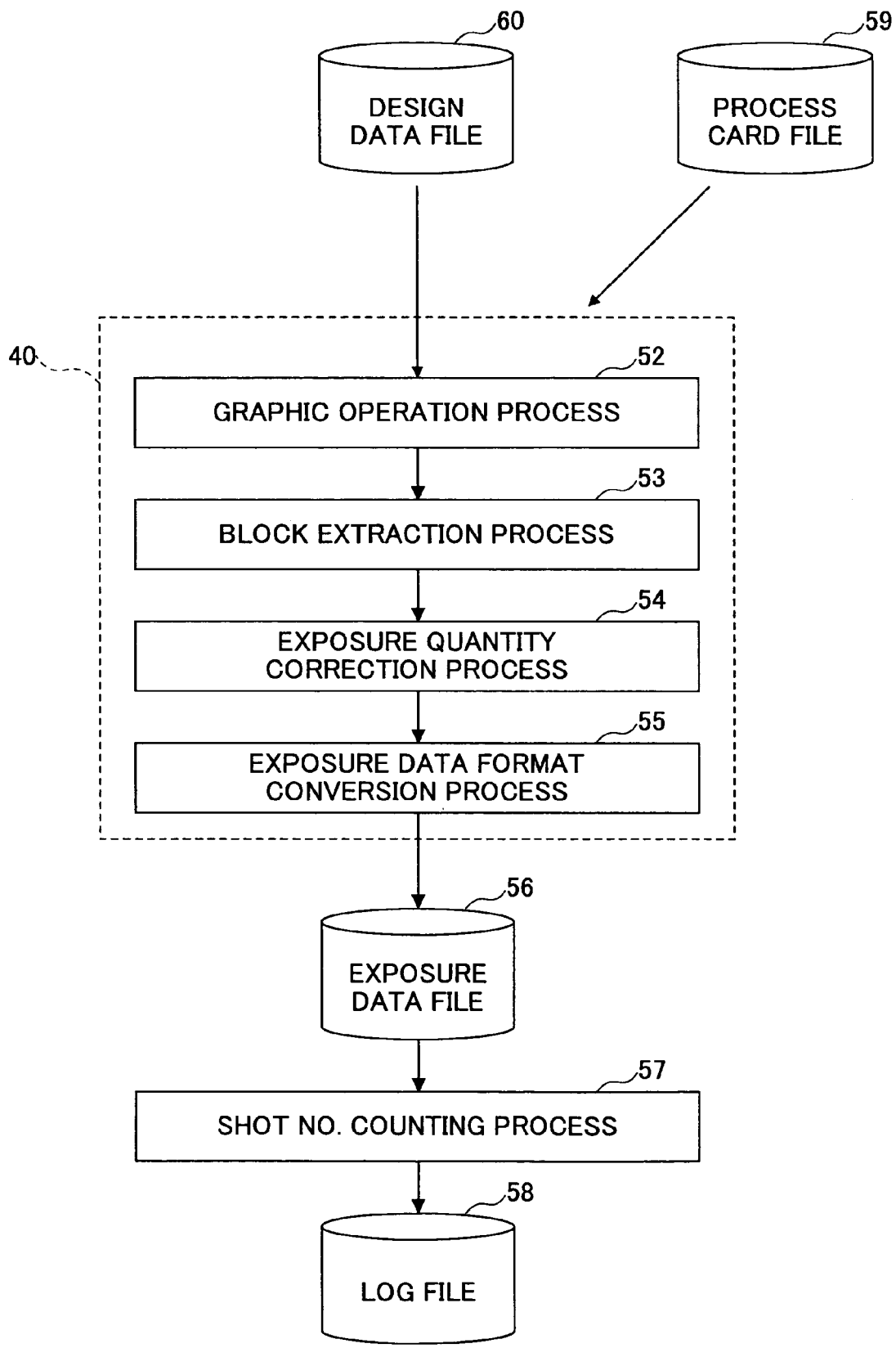
FIG. 5 is a flow chart for explaining an exposure data creating process and a shot number counting process.

FIG. 5 is a flow chart for explaining the exposure data creating process and a shot number counting process. A process card file 59 and a design data file 60 are stored in the storage part of the computer system, for example. Size changing values of the patterns in a graphic operation process, unique numbers (hereinafter referred to as semiconductor device numbers) defined with respect to the semiconductor devices, and the like are described in the process card file 59. It is assumed for the sake of convenience that one kind of semiconductor device number is described. Design data related to the semiconductor devices to be produced are described in the design data file 60.

The step 40 includes steps 52 through 55 as shown in FIG. 5. The step 52 inputs design data of a design data file 50, and carries out the graphic operation process including logic operation and geometrical operation processes such as an OR process and a shift process, a process of eliminating an overlap of the patterns, and a process of changing sizes of the patterns.

The step 53 carries out a block extraction process to extract blocks. This block extraction process extracts as blocks, groups of patterns that are repeatedly arranged, such as pattern groups of SRAM parts. The patterns other than the blocks become variable rectangle exposure patterns.

The step 54 carries out an exposure quantity correction process to set an exposure quantity (or an amount of exposure) for the blocks and the variable rectangle exposure patterns.

The step 55 carries out an exposure data format conversion process to create the exposure data according to exposure data format specifications, and to output an exposure data file 56 which stores the blocks, the variable rectangle exposure patterns and the semiconductor device numbers. The exposure data file 56 is stored in the storage part of the computer.

A step 57 carries out the shot number counting process to count the shot number (that is, the number of shots) of the exposure data of the input exposure data file 56, and to output a log file 58 which describes the shot number and the semiconductor device number. The log file 58 is stored in the storage part of the computer.

Figure 6:
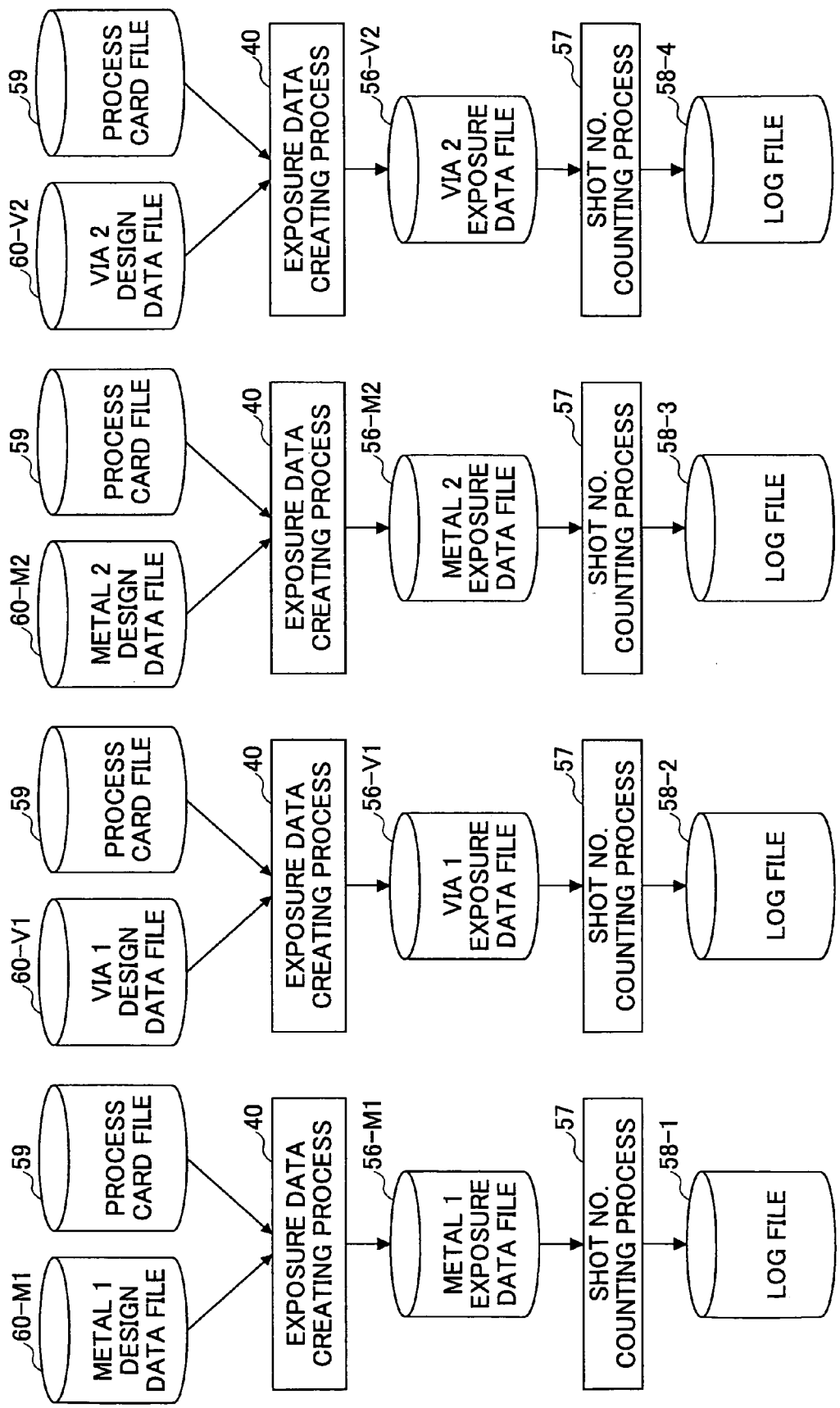
FIG. 6 is a diagram for explaining a case where the exposure data creating process and the shot number counting process are carried out in parallel.

For example, in a case where the layers to which the electron beam exposure is applied include the plurality of wiring layers and the plurality of via layers, the exposure data creating process of the step 40 and the shot number counting process of the step 57 are carried out in parallel by a plurality of computers or, by a plurality of CPUs within a single computer, as shown in FIG. 6. FIG. 6 is a diagram for explaining the case where the exposure data creating process and the shot number counting process are carried out in parallel. In FIG. 6, those parts that are the same as those corresponding parts in FIG. 5 are designated by the same reference numerals, and a description thereof will be omitted. The same semiconductor device number of one kind is described in each of the process card files 59. For example, the design data related to first and second metal wiring layers are described in corresponding design data files 60-M1 and 60-M2, and the design data related to first and second via layers are described in corresponding design data files 60-V1 and 60-V2. Exposure data files 56-M1 and 56-M2 include the corresponding exposure data related to the first and second metal wiring layers, and exposure data files 56-V1 and 56-V2 include the corresponding exposure data related to the first and second via layers. Log files 58-1 through 58-4 are stored in the storage part of the computers or computer by the shot number counting process of the step 57.

[Producing Number Determination Process]

Figure 7:
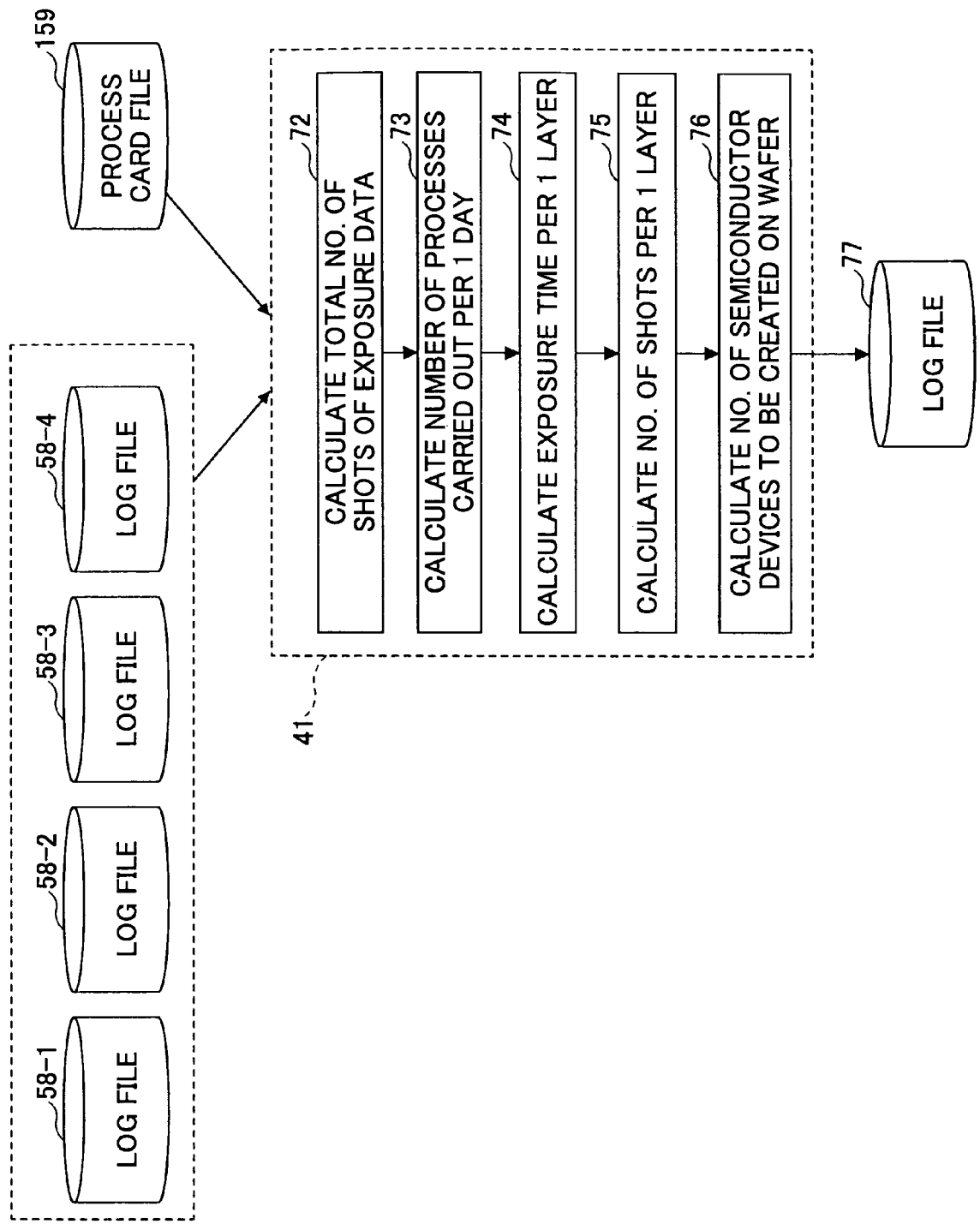
FIG. 7 is a flow chart for explaining a producing number determination process.

FIG. 7 is a flow chart for explaining the producing number determination process of the step 41. For example, the log files 58-1 through 58-4 shown in FIG. 6 and a process card file 159 are input, and the number of semiconductor devices to be produced (that is, the producing number) is determined for a case where the first metal wiring layer, the first via layer, the second metal wiring layer and the second via layer are exposed by the electron beam exposure. The following items k1 through k9 are described in the process card file 159.

k1: Lot number;

k2: Wafer size (units in inches of millimeters, for example);

k3: Number of wafers;

If the semiconductor devices to be produced as engineering samples, it is possible to produce a desired number of engineering samples using one wafer, but a plurality of wafers are used in the following cases.

Figure 2:
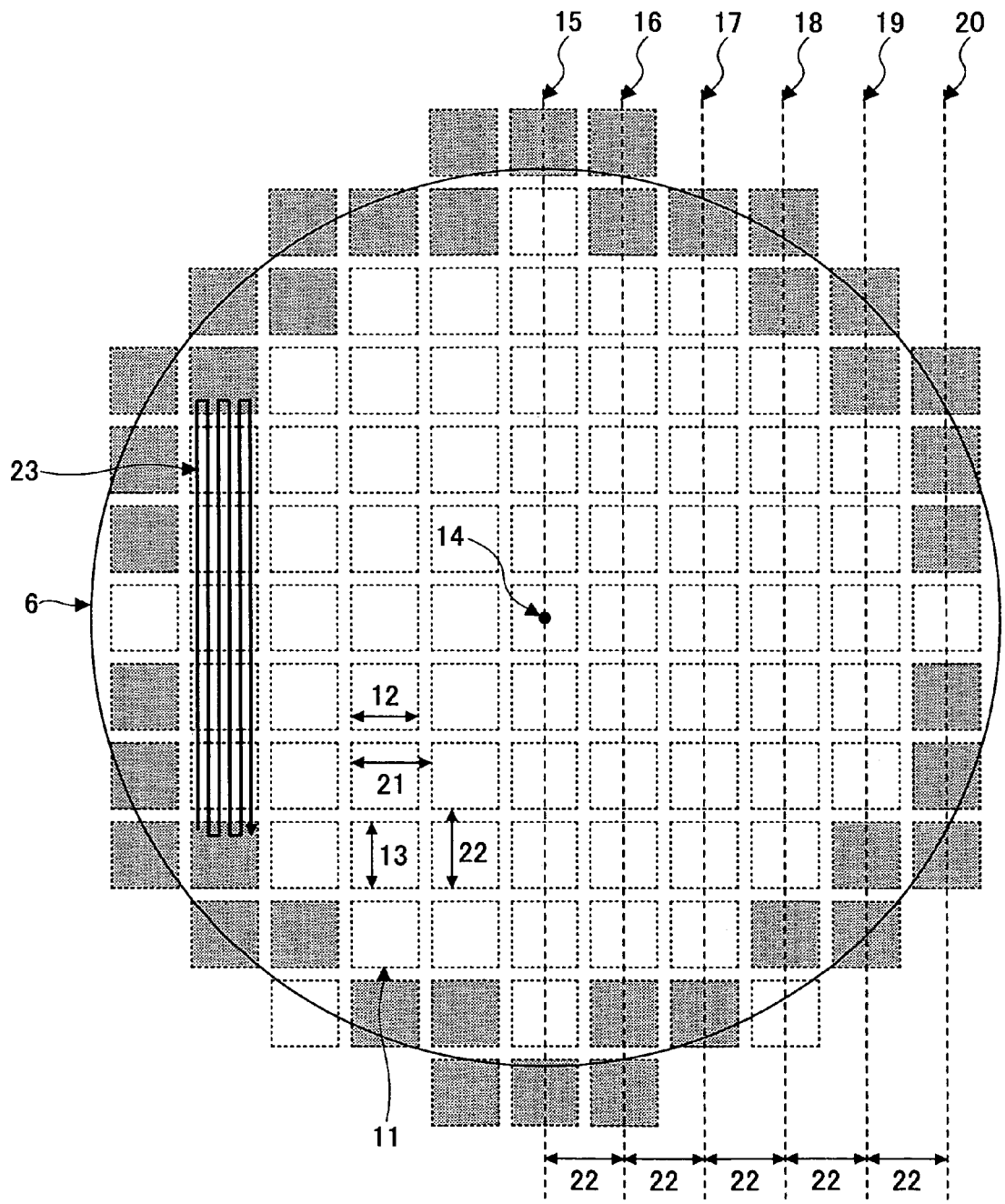
FIG. 2 is a diagram showing an example of a layout of semiconductor devices on a wafer.
Figure 3A:
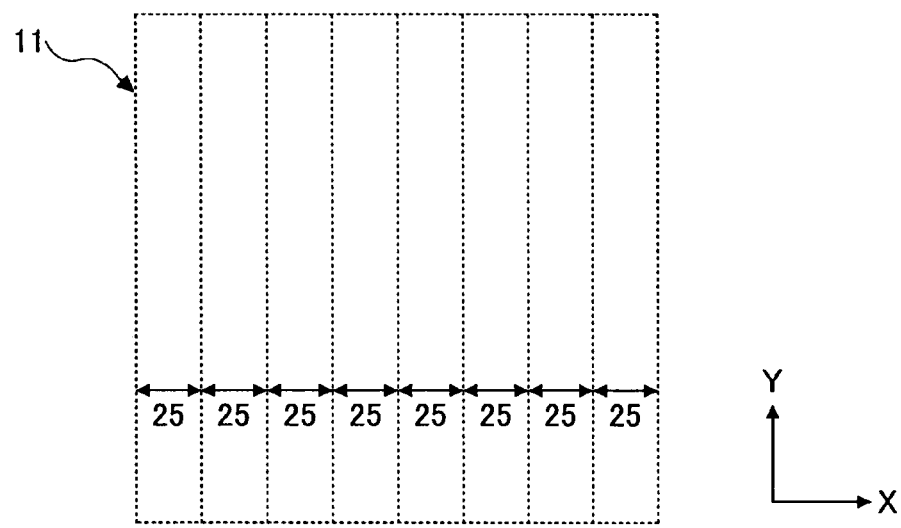
FIGS. 3A and 3B are diagrams for explaining an exposure sequence of the semiconductor devices.
Figure 3B:
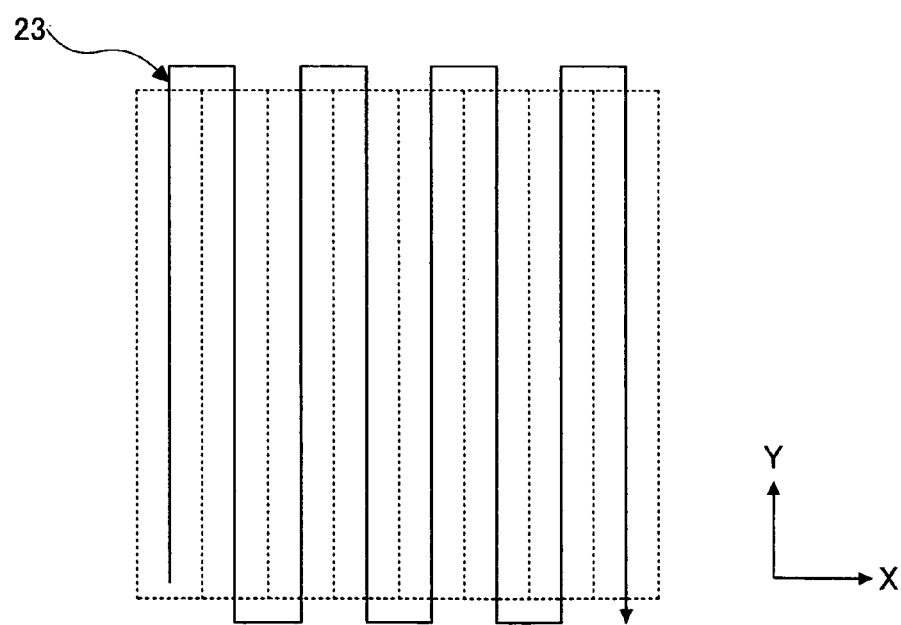

A case where the semiconductor devices are produced on a plurality of wafers by supposing a trouble in the wafer process (for example, damage to the wafer during transport); and A case where the semiconductor devices are to be produced using a plurality of ion injection quantities for the ion implantation in the wafer process.

k4: Semiconductor device size (units in millimeters, for example);

In the example shown in FIG. 2, the sizes 12 and 13 are described as the semiconductor device size.

k5: Number of electron beam exposure applying layers;

The item k5 indicates the number of electron beam exposure applying layers, that is, the number of layers for which the electron beam exposure is carried out, and is 4 layers in the case shown in FIG. 7. Other layers are exposed by ultraviolet light or the like using a reticle.

k6: Basic process number of the wafer process; The item k6 indicates the number of basic processes of the wafer process, and changes depending on the technology (for example, the 130 nm technology or the 90 nm technology) and the number of layers of the semiconductor device.

k7: Number of days allocated for the wafer process;

The item k7 indicates the number of days allocated for the wafer process, which excludes the days required for an inspection process and an assembling process, from the number of days required from the time of order to the time limit of delivery (or delivery date).

k8: Electron beam exposure apparatus coefficients; and

The item k8 indicates the coefficients of the electron beam exposure apparatus, in which there are described 2 kinds of coefficients (C1 and C2) of a calculation formula representing a first order function of the exposure time (for example, time E) and a shot number S. The exposure time E is described by $E=(C1 \times S)+C2$, and the shot number S is in units such as giga (G). In other words, the electron beam exposure apparatus coefficients C1 and C2 is the first order function having the shot number S along the abscissa and the exposure time E along the ordinate, and these electron beam exposure apparatus coefficients C1 and C2 are measured by actually carrying out the exposure. For example, in order to start the wafer process applied with the electron beam exposure, the patterns for inspecting circuit characteristic and the like are exposed beforehand in general, and the electron beam exposure apparatus coefficients C1 and C2 may be obtained from the exposure time E and the shot number S of this exposure of the patterns for the inspection. The units of the exposure time E may be hours, minutes or seconds.

k9: Yield.

The item k9 describes a yield Yd of the semiconductor devices. For example, the yield Yd indicates an average yield or the like for the semiconductor devices that have been produced in the past.

The step 41 includes steps 72 through 76 as shown in FIG. 7. The step 72 reads the shot numbers described in all of the log files 58-1 through 58-4, and calculates a total shot number (that is, a total number of shots) of exposure data. The total shot number of the exposure data amounts to a total shot number St per 1 semiconductor device.

The step 73 calculates a process number (that is, a number of processes) Sn carried out in 1 day (or 24 hours) in the wafer process. The process number Sn to be carried out in 1 day (that is, the number of processes to be carried out in 1 day) may be calculated from Sn=Sb/Dn, using a basic process number (that is, a number of basic processes) Sb of the wafer process and a number of days Dn to be allocated for the wafer process. The number of days Dn to be allocated for the wafer process may be obtained by a reverse operation from the time limit of delivery based on the number of days that can be allocated for the wafer process. If the term Sb/Dn is not perfectly divisible and there is a remainder, the fractions of the quotient may be counted as a whole number. In the production line, the operations are carried out so as to be in strict accord with the calculated process number Sn to be carried out in 1 day.

The step 74 calculates an exposure time E1 per 1 layer. For example, in a case where the process number Sn to be carried out in 1 day, which is calculated in the step 73, is 6, it is assumed for the sake of convenience that 1 process must be carried out in 4 hours (=24 hours/6). In addition, if the number of wafers is 4, the exposure time per 1 wafer becomes 1 hour (=4 hours/4 wafers). Accordingly, the exposure time E1 may be calculated based on the process number Sn (=Sb/Dn) to be carried out in 1 day and the number of wafers used for the production of the semiconductor devices.

In the particular case shown in FIG. 7, the first metal wiring layer, the first via layer, the second metal wiring layer and the second via layer are exposed in this sequence, and it is assumed for the sake of convenience that the exposure time E1 of each of these layers must be within 1 hour or, the exposure time on an average for the 4 layers must be within 1 hour.

A relationship between a time Et that is actually required for the exposure of 1 semiconductor device and the exposure time E1 per 1 layer may be described by the following formula, where St denotes a total shot number (that is, a total number of shots) per 1 semiconductor device, Es denotes an exposure time per 1 shot, M denotes a number of semiconductor devices to be produced, and Ln denotes the number of layers.

$$St \times Es \times M = E1 \times Ln$$

The step 75 calculates a shot number (that is, a number of shots) S1 per 1 layer. The shot number S1 per 1 layer may be calculated from the calculation formula E1=(C×S1)+C2 of the electron beam exposure apparatus coefficients C1 and C2 of the item k8 described above. For example, if the exposure time E1 per 1 layer calculated by the step 74 is 1 hour, and the electron beam exposure apparatus coefficients C1 and C2 from the process card file 159 respectively are 0.5, the shot number S1 per 1 layer becomes 1 G. In the particular case shown in FIG. 7, it is assumed for the sake of convenience that the shot number S1 for each of the first metal wiring layer, the first via layer, the second metal wiring layer and the second via layer must be within 1 G per 1 wafer or, the shot number on an average for the 4 layers must be within 1 G.

The step 76 calculates the number of semiconductor devices to be created on 1 wafer, that is, the number M of semiconductor devices to be produced, based on the following formula.

$$St \times (M \times Yd) = S1 \times Ln$$

The above formula may be rewritten for the number M of semiconductor devices to be produced, as follows.

$$M = (S1 \times Ln)/(St \times Yd)$$

The number M of semiconductor devices to be produced can be calculated from the above formula, because the total shot number St per 1 semiconductor device is the value obtained in the step 72, the shot number S1 per 1 layer is the value obtained in the step 75, and the yield Yd and the number Ln of layers are described in the process card file 159. In other words, the number M of semiconductor devices to be produced may be calculated based on the time limit of delivery of the semiconductor devices, the number of wafers used for the production of the semiconductor devices, and the like.

Therefore, a log file 77 is output and stored in the storage part of the computer. The semiconductor device numbers described in the log files 58-1 through 58-4, the lot number, the wafer size and the semiconductor device size described in the process card file 159, the process number Sn carried out in 1 day obtained in the step 73, and the number M of semiconductor devices to be produced obtained in the step 76 are described in the log file 77 that is output. For example, the log file 77 is sent to a concerned robot of the production line or to a concerned person in charge of the production line, via the Internet or the like. In this case, the concerned robot of the production line or the concerned person in charge of the production line carries out the operation so as to be in strict accord with the process number Sn to be carried out in 1 day, by referring to the lot number, the process number Sn and the like described in the log file 77.

[Layout Determination Process]

Figure 8:
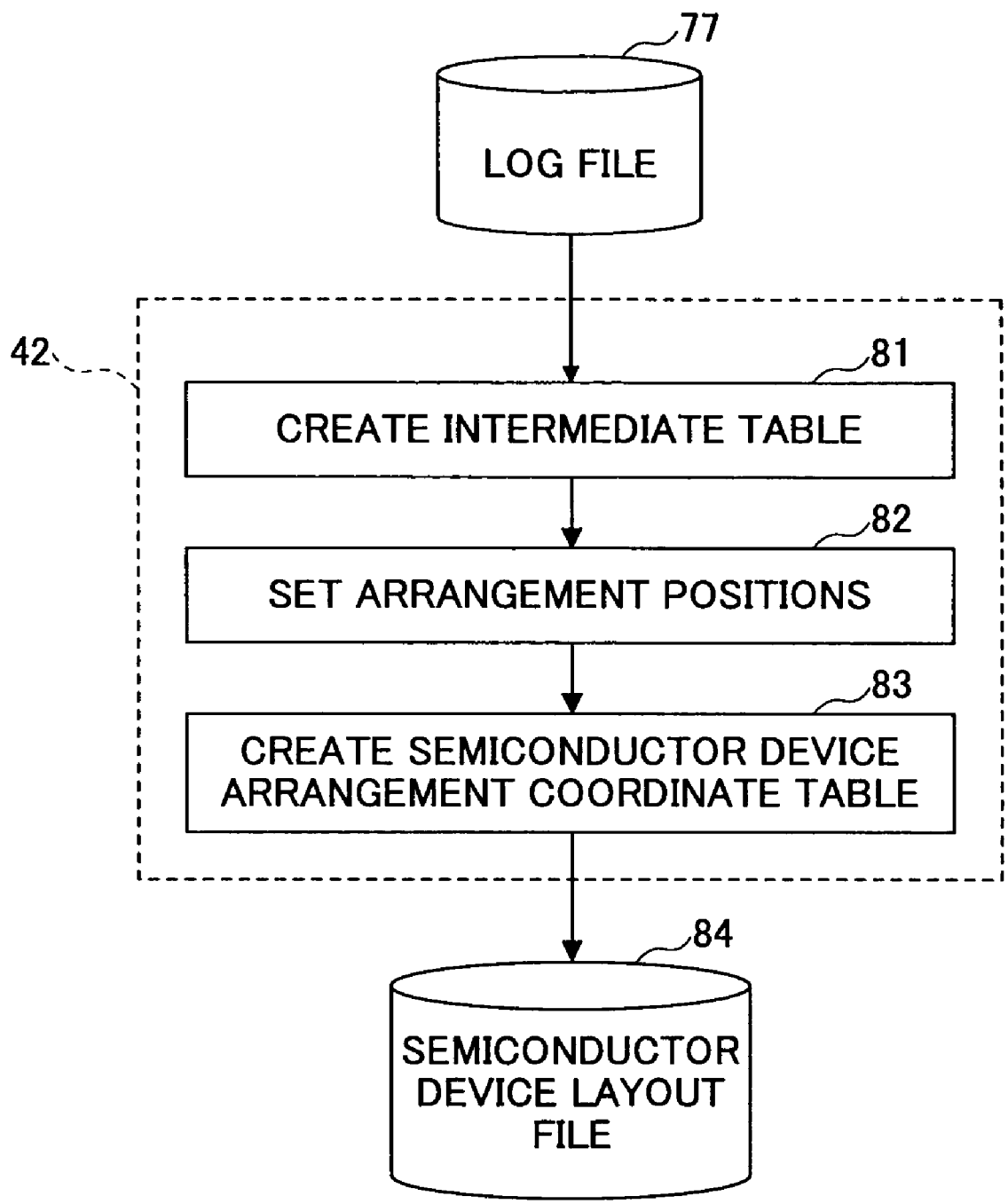
FIG. 8 is a flow chart for explaining a layout determination process.

FIG. 8 is a flow chart for explaining the layout determination process of the step 42. For example, the log file 77 shown in FIG. 7 is input, and the layout of the semiconductor devices is created based on the log file 77.

A step 81 shown in FIG. 8 reads the log file 77 and determines the arrangement of the semiconductor devices on the wafer according to the specifications shown in FIG. 2, for example, by referring to the wafer size and the semiconductor device size described in the log file 77, and creates an intermediate table 500 for determining the arrangement coordinates of the semiconductor devices on the wafer. FIG. 9 is a diagram showing an example of the intermediate table 500.

As shown in FIG. 9, the intermediate table 500 includes an arrangement position number N, arrangement flags F, coordinates X, and coordinates Y. The arrangement position number N indicates the number of coordinates of the semiconductor devices that can be arranged on (that is, arrangeable on) the wafer, and is not the number M of semiconductor devices to be produced. The arrangement position number N differs depending on the wafer size and the semiconductor device size. However, the coordinates of the semiconductor devices indicated by the hatching in FIG. 2, which cannot be arranged on the wafer in their entirety, are not included in the arrangement position number N.

The arrangement flag F indicates whether or not a semiconductor device is arranged at the coordinate where the semiconductor device is arrangeable on the wafer. For example, the arrangement flag F stores "1" if a semiconductor device is actually arranged at the coordinate where the semiconductor device is arrangeable on the wafer, and the arrangement flag F stores "0" if no semiconductor device is actually arranged at the coordinate where the semiconductor device is arrangeable on the wafer.

The coordinates X and Y indicate the arrangement position of the semiconductor device on the wafer, and for example, the center position of each semiconductor device on the wafer is indicated by the coordinates X and Y. The origin of the XY coordinates matches the center of the wafer, for example. In addition, the number of pairs of coordinates X and Y is equal to the arrangement position number N.

A step 82 determines the arrangement position of the semiconductor device on the wafer, and stores "1" in the arrangement flag F of the corresponding pair of coordinates X and Y. The number of semiconductor devices for which the arrangement position must be determined is equal to the number M of semiconductor devices to be produced stored in the log file 77.

Figure 10:
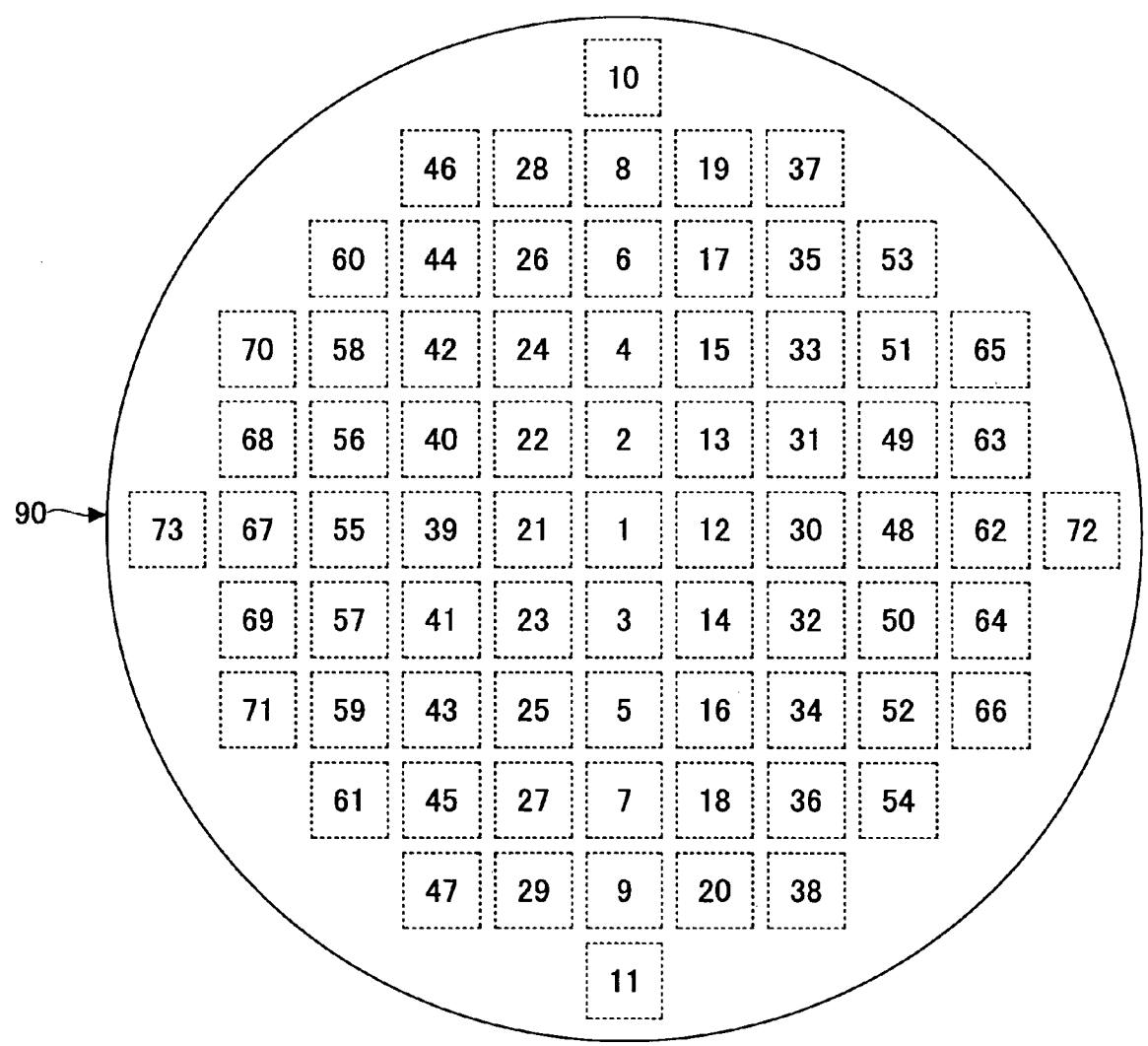
FIG. 10 is a diagram showing an example of a layout of semiconductor devices on a wafer.

Next, a description will be given of an order of priority with which the semiconductor devices are arranged on the wafer, by referring to FIG. 10. FIG. 10 is a diagram showing an example of the layout of the semiconductor devices on the wafer. A wafer 90 shown in FIG. 10 corresponds to the wafer 6 shown in FIGS. 1 and 2. In FIG. 10, arrangement positions "1" through "73" of the semiconductor devices are indicated by broken line rectangles, and the numbers assigned to the arrangement positions indicate the order of priority with which the semiconductor devices are arranged on the wafer 90. In FIG. 2, for example, the exposure is carried out in the sequence indicated by the arrow 23, but the exposure is not carried out during a predetermined time in which the exposure folds back (or switches back) along the moving direction. But as the number of semiconductor devices arranged in one column increases, the number of times the exposure folds back decreases, to thereby reduce the exposure time. Further, in the wafer 90 shown in FIG. 10, the probability of the semiconductor device becoming defective tends to be lower for the semiconductor devices arranged closer to the center of the wafer 90. Hence, the semiconductor devices are arranged on the wafer 90 starting from the center column, and semiconductor devices are thereafter arranged in the columns closer to the center column so that in each column the semiconductor devices are arranged starting from the position closer to the center of the wafer 90.

Figure 11:
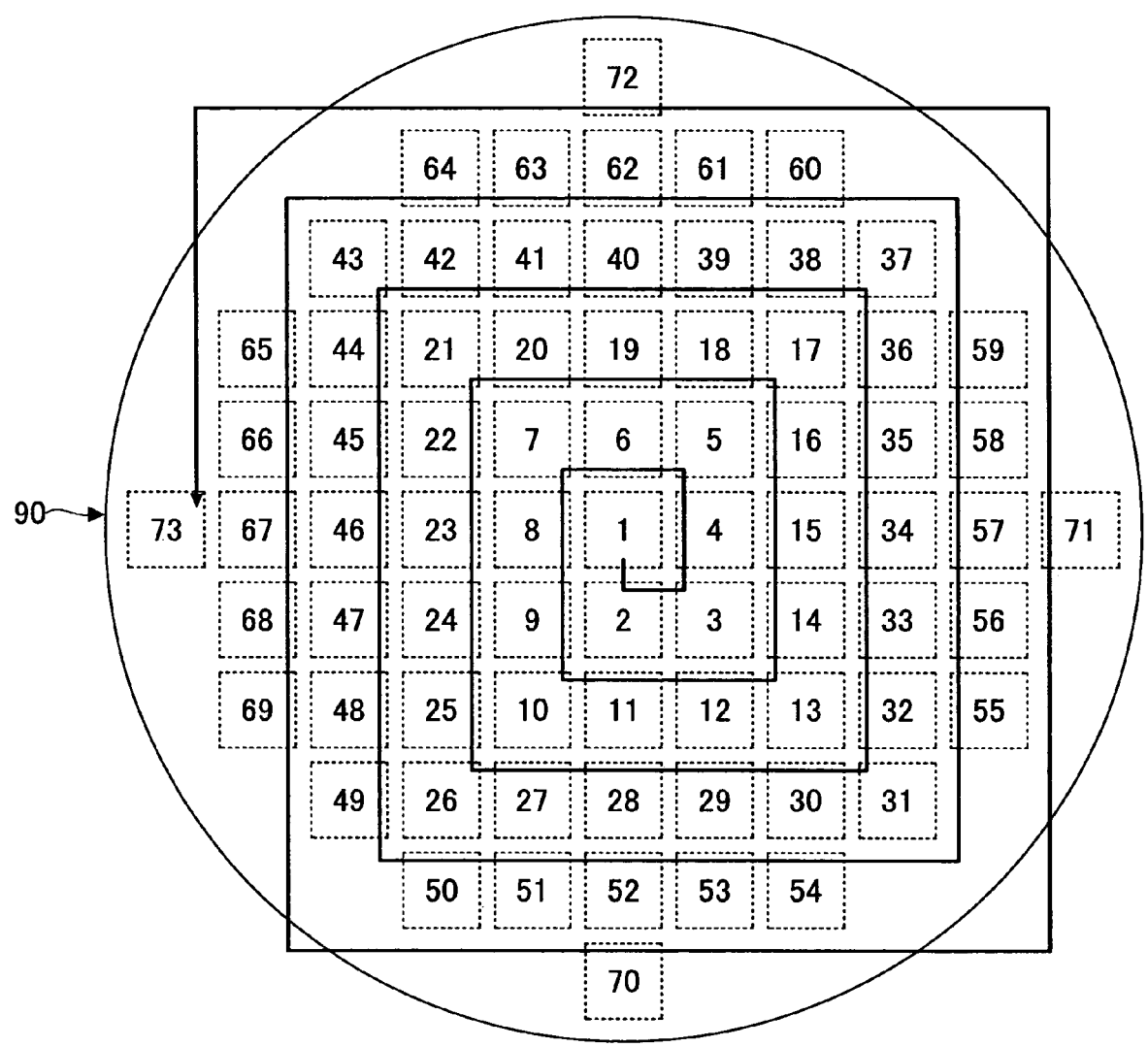
FIG. 11 is a diagram showing another example of the layout of the semiconductor devices on the wafer.

FIG. 11 is a diagram showing another example of the layout of the semiconductor devices on the wafer. In FIG. 11, arrangement positions "1" through "73" of the semiconductor devices are indicated by broken line rectangles, and the numbers assigned to the arrangement positions indicate the order of priority with which the semiconductor devices are arranged on the wafer 90. Because the probability of the semiconductor device becoming defective tends to be lower for the semiconductor devices arranged closer to the center of the wafer 90, the semiconductor devices are arranged on the wafer 90 starting from the center of the wafer 90, and the semiconductor devices are thereafter arranged in a spiral manner.

In the intermediate table 500, "1" is stored with respect to the corresponding pairs of coordinates X and Y, for the arrangement position number N (the number of coordinates of the semiconductor devices that are arrangeable on the wafer 90), in the sequence of numbers indicating the order of priority with which the semiconductor devices are arranged on the wafer 90.

A step 83 shown in FIG. 8 creates a semiconductor device arrangement coordinate table 501, and outputs a semiconductor device layout file 84. The semiconductor device layout file 84, which includes the semiconductor device arrangement coordinate table 501, is stored in the storage part of the computer.

FIG. 12 is a diagram showing an example of the semiconductor device arrangement coordinate table 501. The semiconductor device arrangement coordinate table 501 includes a total word number (that is, a total number of words), a semiconductor device number, a number M of semiconductor devices to be produced, a wafer size, a semiconductor device size (X), a semiconductor device size (Y), a coordinate X and a coordinate Y.

The total word number indicates the number of words within the semiconductor device arrangement coordinate table 501. In the case shown in FIG. 12, the total word number is (6+(M×2)). The semiconductor device number is the number assigned to the semiconductor device described in the log file 77. The number M of semiconductor devices to be produced indicates the number of semiconductor devices to be produced on the wafer, and is stored in the semiconductor device arrangement coordinate table 501 by referring to the log file 77. The wafer size is stored in the semiconductor device arrangement coordinate table 501 by referring to the log file 77. The semiconductor device size (X) and the semiconductor device size (Y) respectively are the sizes of the semiconductor device in the X-direction and the Y-direction, and are stored in the semiconductor device arrangement coordinate table 501 by referring to the log file 77. The coordinates X and Y indicate the arrangement position of the corresponding semiconductor device on the wafer, and pairs of coordinates X and Y for which "1" is stored in the corresponding arrangement flags F are stored in the semiconductor device arrangement coordinate table 501 by referring to the intermediate table 500. In this case, the number of pairs of coordinates X and Y is equal to the number M of semiconductor devices to be produced.

The semiconductor device layout file 84 is sent to the electron beam exposure apparatus via the Internet, for example.

[Exposure Process]

The exposure process is carried out by inputting the exposure data of the exposure data file 56 and the semiconductor device layout file 84 to the electron beam exposure apparatus. The electron beam exposure apparatus having the structure shown in FIG. 1A or FIG. 1B may be used for the exposure process.

Second Embodiment

Figure 13:
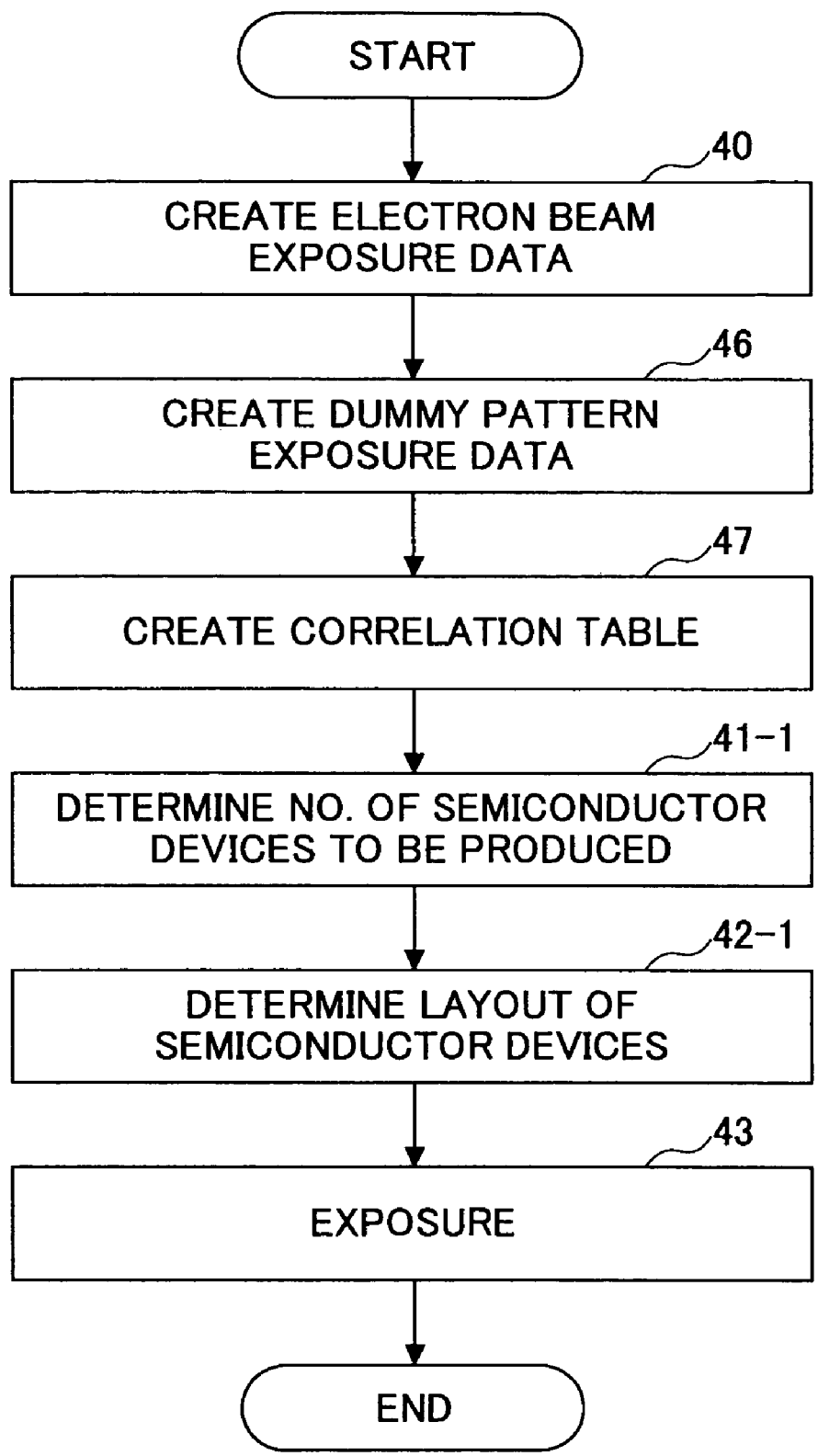
FIG. 13 is a flow chart for explaining a second embodiment of the method of manufacturing the semiconductor devices according to the present invention.

FIG. 13 is a flow chart for explaining a second embodiment of the method of manufacturing the semiconductor devices according to the present invention. This second embodiment of the method of manufacturing the semiconductor devices employs a second embodiment of the layout determination method according to the present invention. A second embodiment of the computer-readable program according to the present invention causes the computer to execute the second embodiment of the layout determination method or the method of manufacturing the semiconductor devices. A second embodiment of the computer-readable storage medium according to the present invention stores this second embodiment of the computer-readable program. In FIG. 13, those steps that are the same as those corresponding steps in FIG. 4 are designated by the same reference numerals, and a detailed description thereof will be omitted.

In FIG. 13, a step 40 carries out an exposure data creating process to create the exposure data used for creating the semiconductor devices on the wafer by the electron beam exposure. A step 46 carries out a dummy pattern exposure data creating process to create exposure data of dummy patterns which will be described later. A step 47 carries out a correlation table creating process to create a correlation table of the number of arrangement positions, indicating a correlation between the number of semiconductor devices to be produced and the number of positions where the dummy patterns are to be exposed, which will be described later. A step 41-1 carries out a producing number determination process to determine the number of semiconductor devices to be created on the wafer and the number of positions where the dummy patterns are to be exposed. A step 42-1 carries out a layout determination process to determine the layout of the semiconductor devices and the dummy patterns on the wafer. A step 43 carries out an exposure process to expose the patterns of the semiconductor devices and the dummy patterns on the wafer, based on the created exposure data, the determined number of semiconductor devices to be created on the wafer, the determined number of positions where the dummy patterns are to be exposed on the wafer, and the determined layout of the semiconductor devices and the dummy patterns on the wafer.

[Exposure Data Creating Process]

The exposure data creating process of the step 40 is the same as that of the first embodiment described above.

[Dummy Pattern Exposure Data Creating Process]

Figure 14:
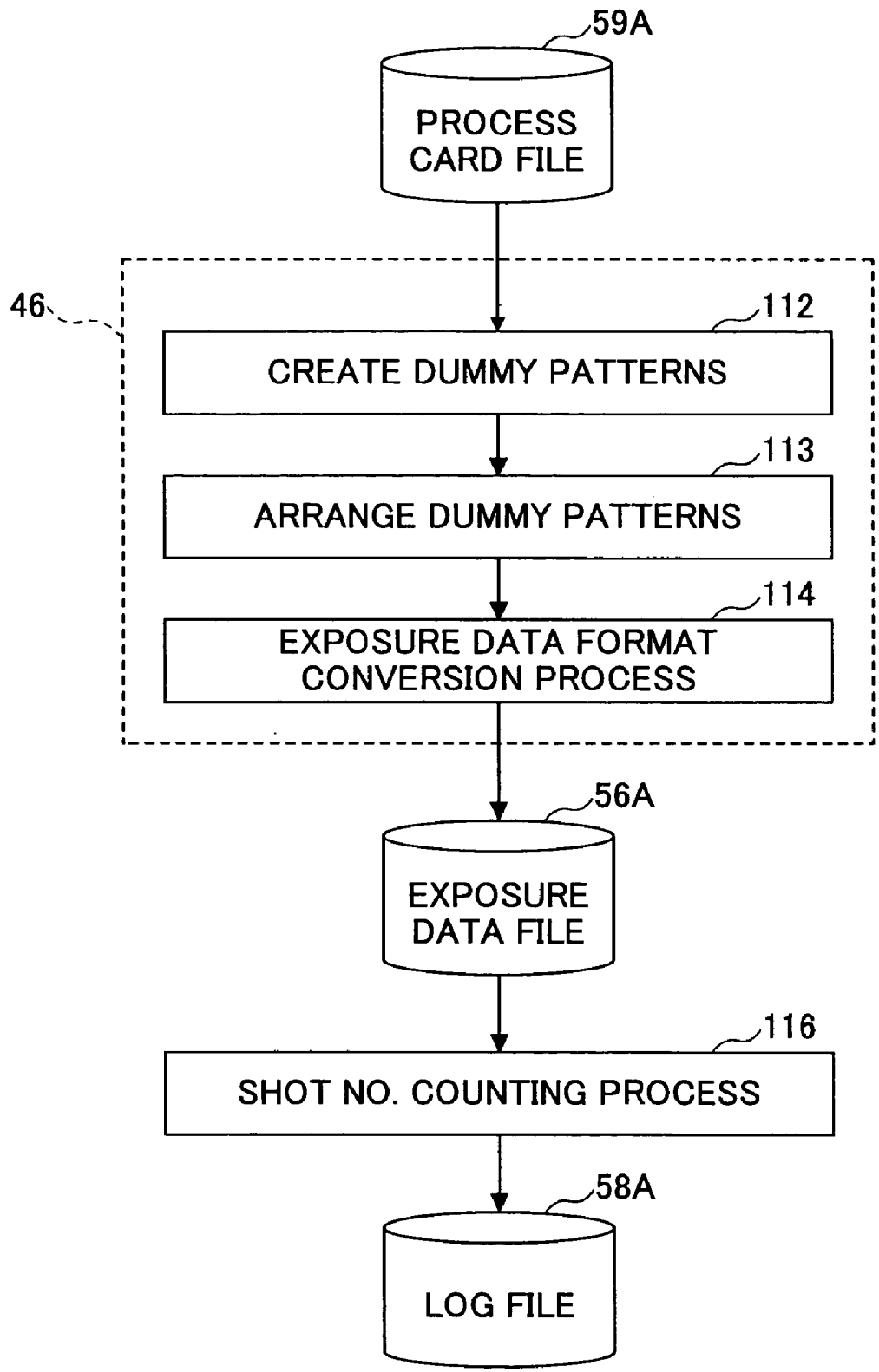
FIG. 14 is a flow chart for explaining a dummy pattern exposure data creating process and a shot number counting process.

FIG. 14 is a flow chart for explaining a dummy pattern exposure data creating process of the step 46 and a shot number counting process. The width and height sizes of the dummy patterns for stabilizing the wafer process (for example, an integer greater than or equal to 1 and in units of μm), the interval (or pitch) size between adjacent dummy patterns (an integer greater than or equal to 0 and in units of μm), the sizes of the semiconductor devices (for example, in units of millimeters), and dummy pattern exposure data ID are described in the process card file 59A. For example, the dummy pattern exposure data ID is a character string "DUMMY".

A step 112 creates rectangular dummy patterns, for example, by referring to the width and height sizes of the dummy patterns described in the process card file 59A.

Figure 15:
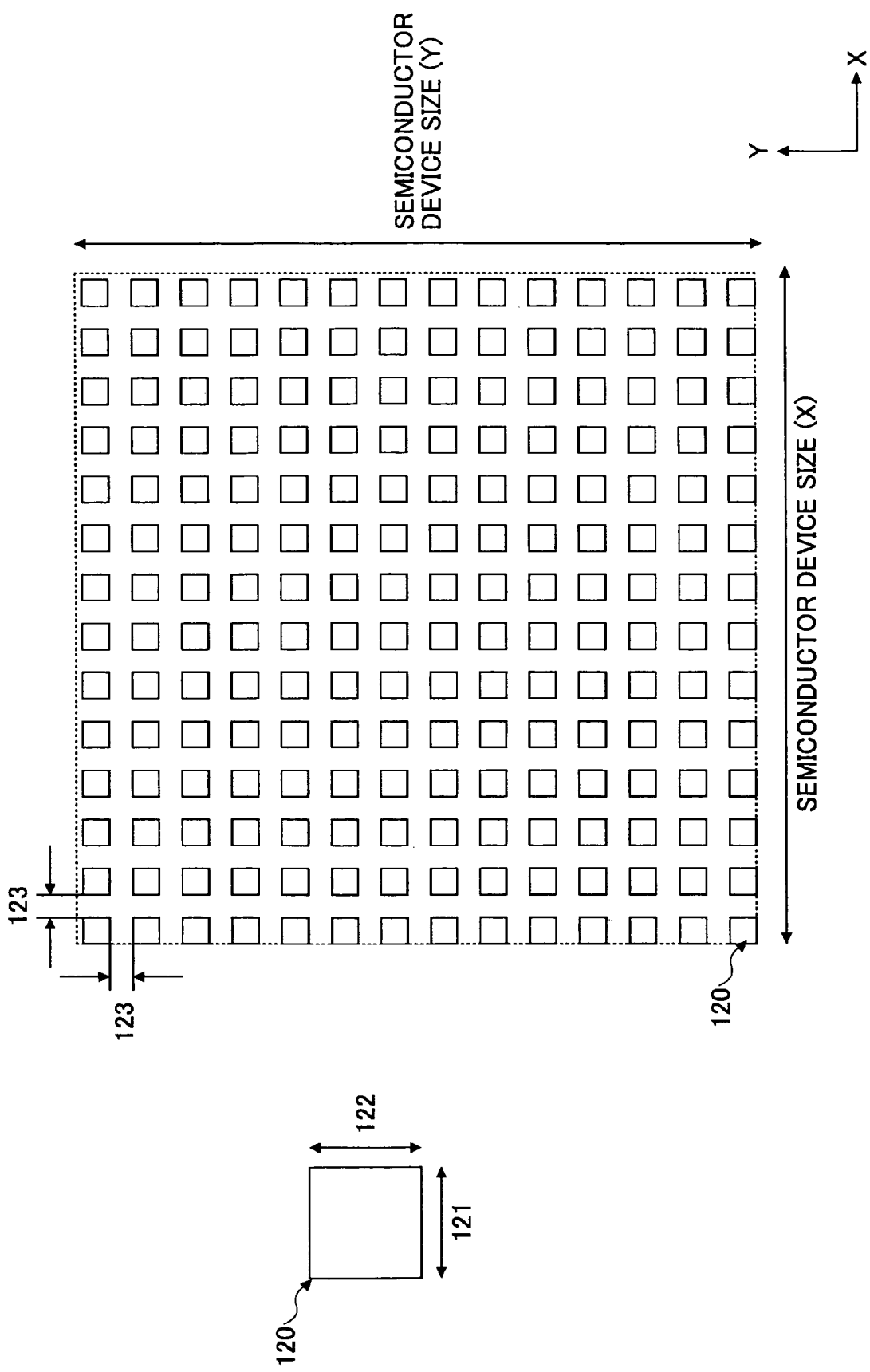
FIG. 15 is a diagram for explaining dummy patterns.

A step 113 arranges the dummy patterns created in the step 112 in a lattice within the semiconductor device size as shown in FIG. 15, at the interval size of the adjacent dummy patterns described in the process card file 59A. FIG. 15 is a diagram for explaining the dummy patterns. In FIG. 15, a dummy pattern 120 has a width size 121 and a height size 122, and the adjacent dummy patterns 120 are arranged at an interval size 123.

A step 114 carries out an exposure data format conversion process to create the exposure data according to the exposure data format specifications, and to output an exposure data file 56A which stores the exposure data of the dummy patterns. The exposure data file 56A is stored in the storage part of the computer.

A step 116 carries out a shot number counting process to count the number of shots of the exposure data in the exposure data file 56A that is input, and to output a log file 58A in which the number of shots (shot number) and the dummy pattern exposure data ID are described. The log file 58A is stored in the storage part of the computer.

[Correlation Table Creating Process]

Figure 16:
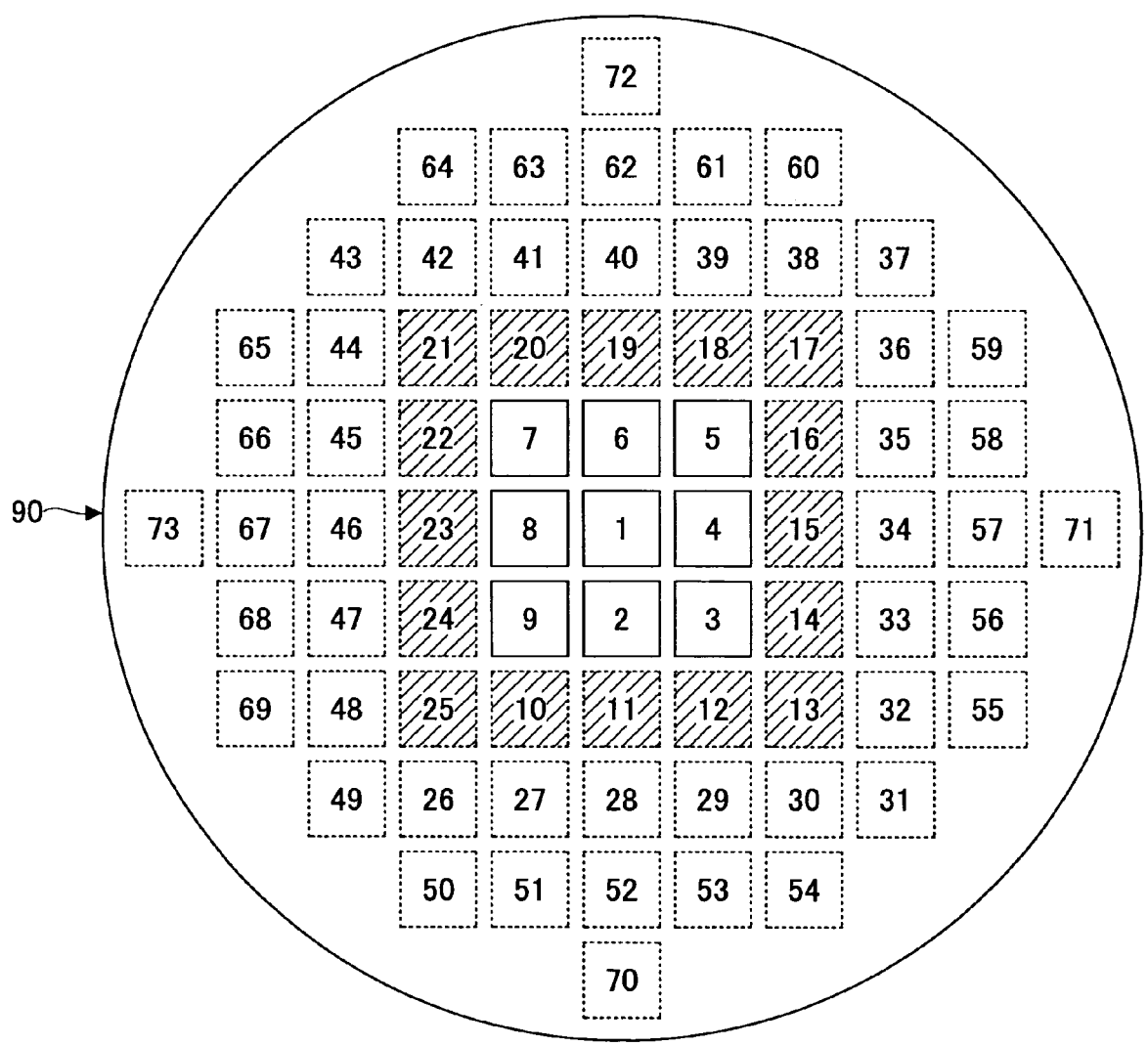
FIG. 16 is a diagram showing an example of a layout of semiconductor devices and the dummy patterns on the wafer.
Figure 17:
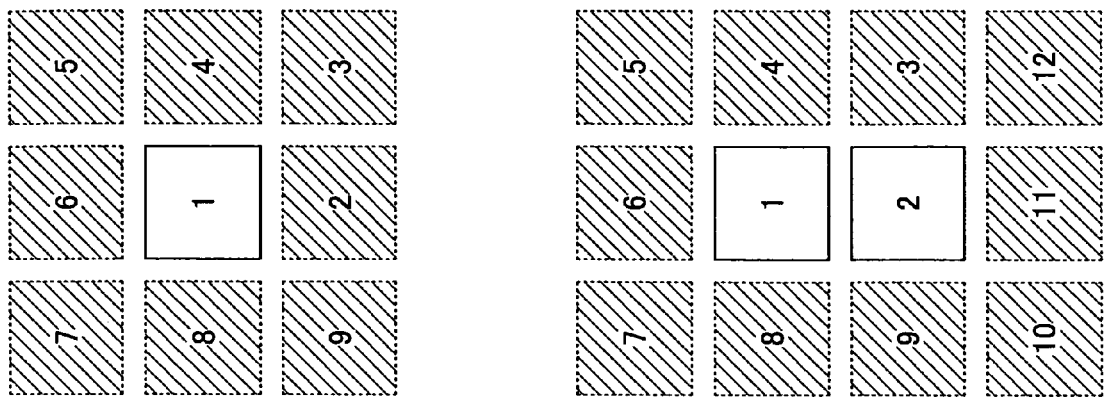
FIG. 17 is a diagram showing an example of a correlation table.

The correlation table creating process of the step 47 calculates the number of positions where the dummy patterns are to be exposed for an arbitrary number of semiconductor devices to be produced, and stores the calculated number of positions where the dummy patterns are to be exposed in the correlation table. The positions where the dummy patterns are to be exposed refers to the periphery of the group of semiconductor devices, such as the arrangement positions completely surrounding the semiconductor device group, and the dummy patterns are exposed at these arrangement positions. FIG. 16 is a diagram showing an example of the layout of semiconductor devices and the dummy patterns on the wafer 90, and FIG. 17 is a diagram showing an example of a correlation table 502. In FIG. 16, the arrangement positions of the semiconductor devices on the wafer 90 are indicated by broken line rectangles, the positions where the semiconductor devices are actually produced are indicated by solid line rectangles, and the arrangement positions where the dummy patterns are exposed on the wafer are indicated by rectangles with hatching. In addition, numerals indicated at each of the arrangement positions in FIG. 16 indicate the order of priority with which the semiconductor devices are arranged.

For example, if the number M of semiconductor devices to be produced is "1" as indicated on the top right portion of FIG. 17, the number Pd of positions where the dummy patterns are to be exposed (that is, the number of positions on the wafer 90 where the dummy patterns are to be exposed) is "8". On the other hand, if the number M of semiconductor devices to be produced is "2" as indicated on the bottom right portion of FIG. 17, the number Pd of positions where the dummy patterns are to be exposed is "10". In the case shown in FIG. 16, the number Pd of positions where the dummy patterns are to be exposed is calculated for the number M of semiconductor devices to be produced, namely, "1" to "73", and stored in the correlation table 502. The correlation table 502 is output as a file and stored in the storage part of the computer.

[Producing Number Determination Process]

Figure 18:
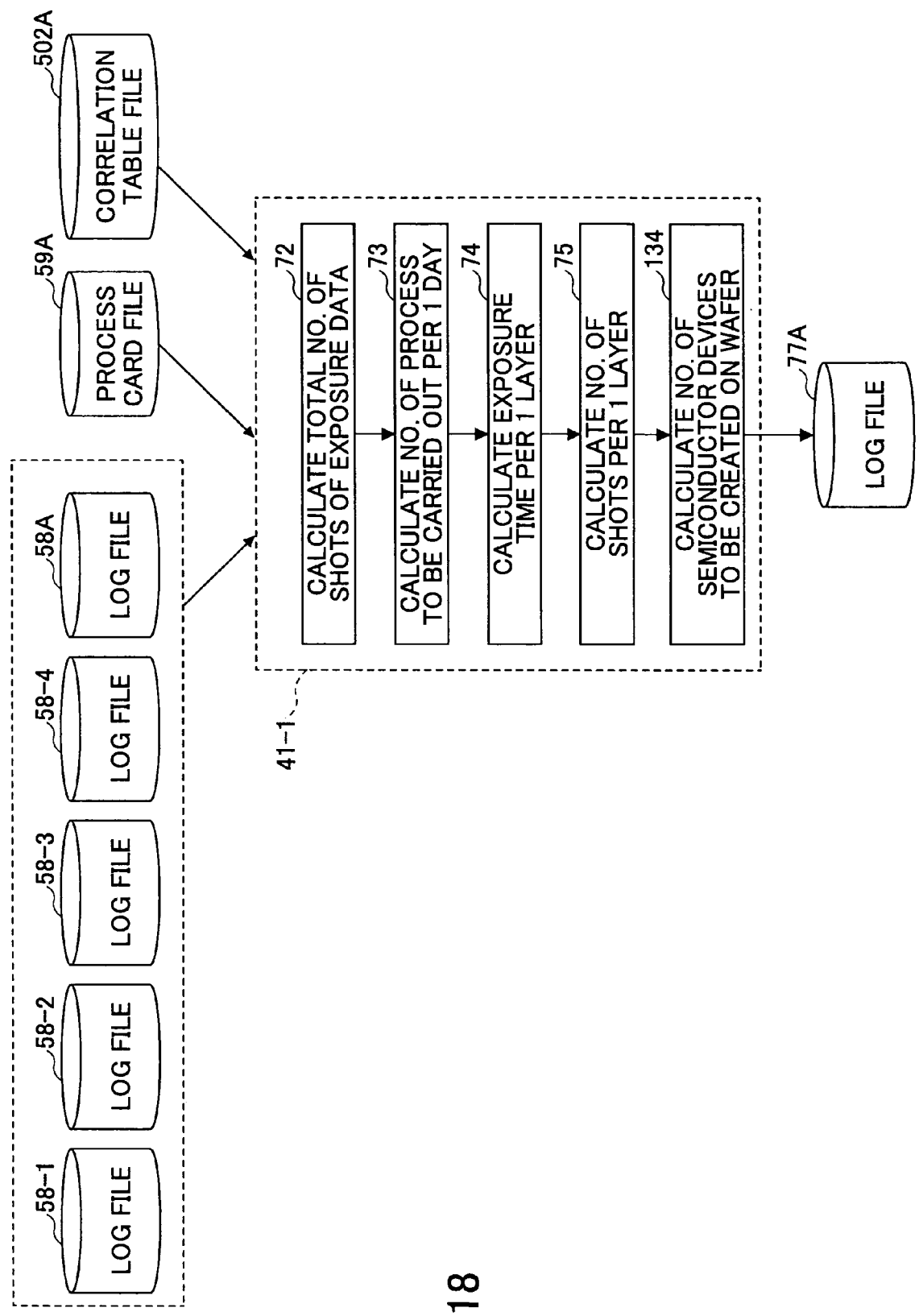
FIG. 18 is a flow chart for explaining a producing number determination process.

FIG. 18 is a flow chart for explaining the producing number determination process of the step 41-1. For example, the log files 58-1 through 58-4 shown in FIG. 6, the log file 58A and the process card file 59A shown in FIG. 14, and a correlation table 502A including the correlation table 502 shown in FIG. 17 are input, and the number M of semiconductor devices to be produced and the number Pd of positions where the dummy patterns are to be exposed are determined. The process of the step 41-1 is the same as that of the step 41 shown in FIG. 7 except for a step 134. All of the items described in the process card file 59, and the number of wiring layers are described in the process card file 59A. In addition, the exposure data of the dummy patterns in the exposure data file 56A are exposed at the exposure positions of the dummy patterns.

The step 134 carries out the producing number determination process, and calculates the number M of semiconductor devices to be produced and the number Pd of positions where the dummy patterns are to be exposed, based on the following formula, where St denotes a total shot number (that is, a total number of shots) per 1 semiconductor device, Yd denotes a yield of the semiconductor devices, Sd denotes a shot number (that is, a number of shots) of the exposure data of the dummy patterns, Lwn denotes a number of wiring layers, E1 denotes a shot number (that is, a number of shots) per 1 layer, and Ln denotes a number of layers.

$$[\{St \times (M \times Yd)\} + \{(Sd \times Lwn) \times Pd\}] \leq (S1 \times Ln)$$

In other words, the step 134 refers to the correlation table 502A, substitutes into the above described formula the number M of semiconductor devices to be produced and the number Pd of positions where the dummy patterns are to be exposed, by successively incrementing by 1 the number M of semiconductor devices to be produced starting from the number M equal to "1", and obtains the maximum for the number M of semiconductor devices to be produced and the number Pd of positions where the dummy patterns are to be exposed for which the above described formula (that is, the relationship) stands. The total shot number St per 1 semiconductor device is the value calculated in the step 72, the yield Yd and the number Lwn of wiring layers are described in the process card file 59A, and the shot number Sd of the exposure data of the dummy patterns are described in the log file 58A. In addition, a log file 77A in which there are described the semiconductor device numbers described in the log files 58-1 through 58-4, the dummy pattern exposure data ID described in the log file 58A, the lot number, the wafer size and the semiconductor device size described in the process card file 59A, the process number (that is, the number of processes) Sn carried out in 1 day obtained by the step 73, and the number M of semiconductor devices to be produced and the number Pd of positions where the dummy patterns are to be exposed obtained by the step 134, is output and stored in the storage part of the computer. For example, the log file 77A is sent to a concerned robot of the production line or to a concerned person in charge of the production line, via the Internet or the like. In this case, the concerned robot of the production line or the concerned person in charge of the production line carries out the operation so as to be in strict accord with the process number Sn to be carried out in 1 day, by referring to the lot number, the process number Sn and the like described in the log file 77A.

Figure 19:
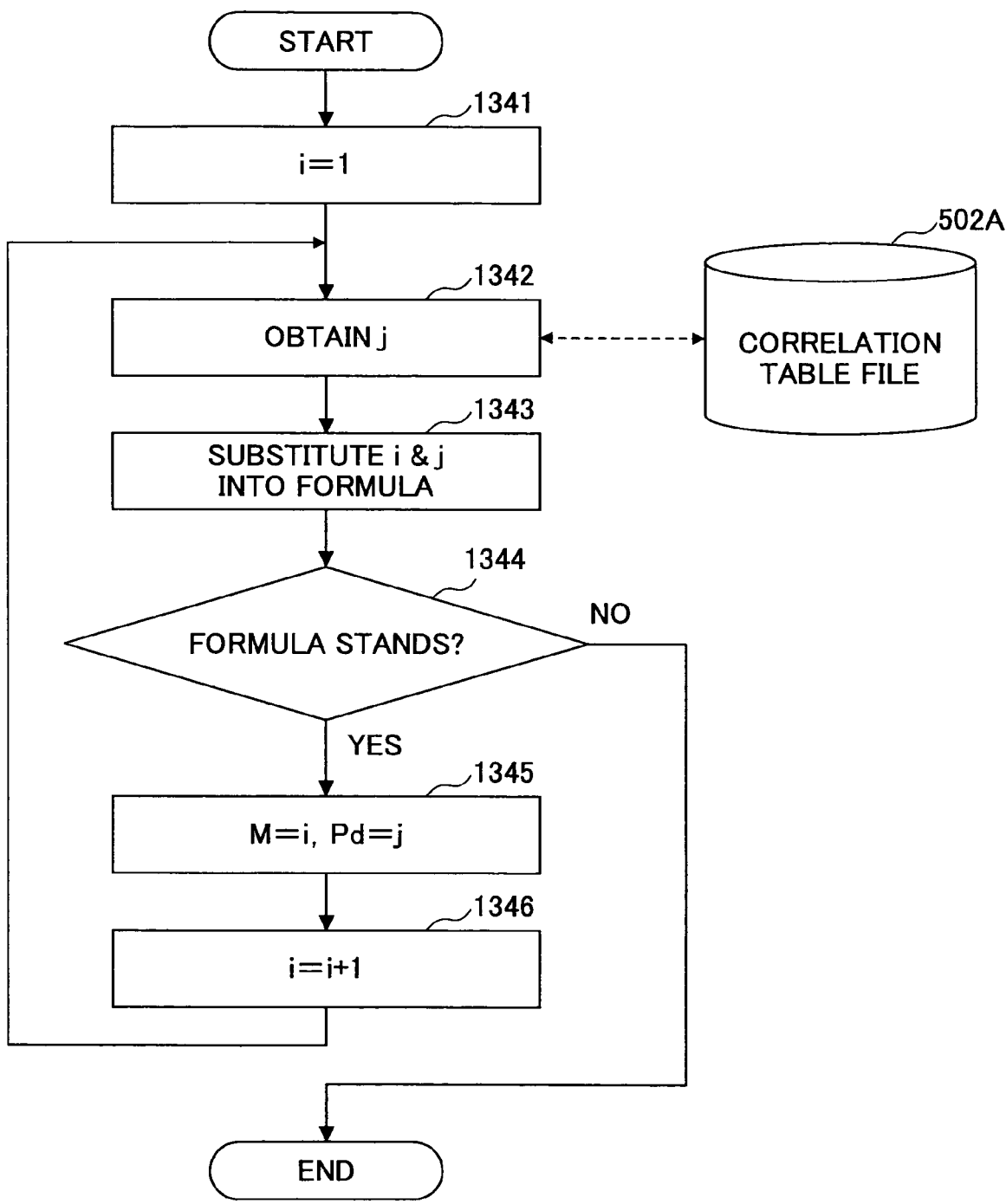
FIG. 19 is a flow chart for explaining an important part of the producing number determination process.

FIG. 19 is a flow chart for explaining an important part of the producing number determination process of the step 134. In FIG. 19, a step 1341 sets a value i to i=1, where i denotes a number of times an intermediate result of the calculation (that is, an intermediate value) is obtained during calculation of the number M of semiconductor devices to be produced. A step 1342 obtains from the correlation table (or file) 502A a value j of the number Pd of positions where the dummy patterns are to be exposed. A step 1343 substitutes into the formula described above the number M of semiconductor devices to be produced and the number Pd of positions where the dummy patterns are to be exposed with respect to the obtained values i and j. A step 1344 decides whether or not the formula (that is, the relationship) described above stands. If the decision result in the step 1344 is YES, a step 1345 sets the numbers M and Pd to M=i and Pd=j, a step 1346 increments i to i=i+1, and the process returns to the step 1342. On the other hand, the process ends if the decision result in the step 1344 is NO. Accordingly, it is possible to obtain the maximum for the number M of semiconductor devices to be produced and the number Pd of positions where the dummy patterns are to be exposed for which the above described formula (that is, the relationship) stands.

[Layout Determination Process]

Figure 20:
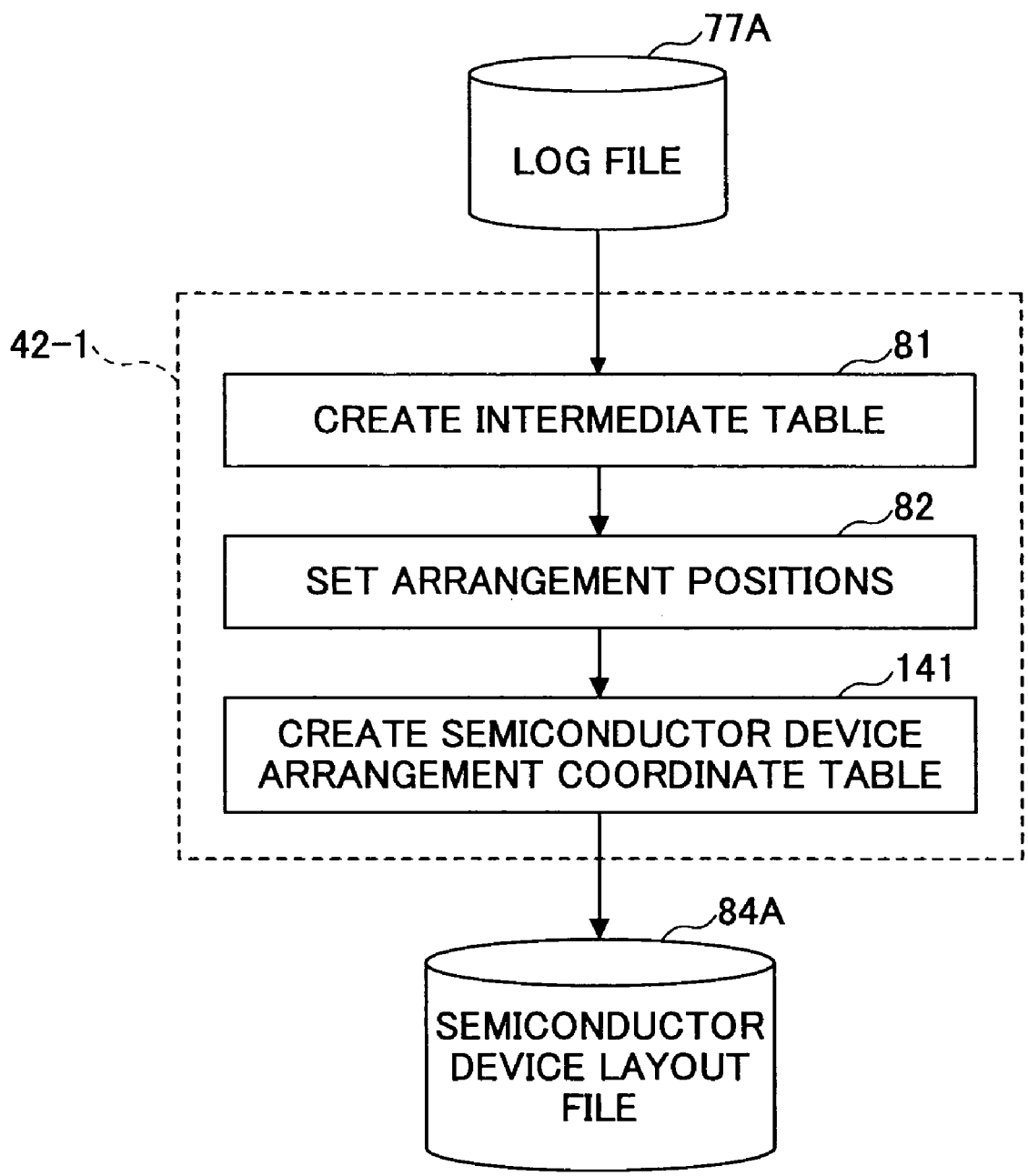
FIG. 20 is a flow chart for explaining a layout determination process.

FIG. 20 is a flow chart for explaining the layout determination process of the step 42-1. For example, the log file 77A shown in FIG. 18 is input, and the layout of the positions where the semiconductor devices and the dummy patterns are to be exposed is created based on the log file 77A.

Processes of steps 81 and 82 shown in FIG. 20 are the same as those shown in FIG. 8, but in this embodiment, the layout shown in FIG. 11 is created and not the layout shown in FIG. 10.

A step 141 creates a semiconductor device arrangement coordinate table 503, and outputs the semiconductor device arrangement coordinate table 503 to the semiconductor device layout file 84A. The semiconductor device layout file 84A including the semiconductor device arrangement coordinate table 503 is stored in the storage part of the computer.

Figure 21:
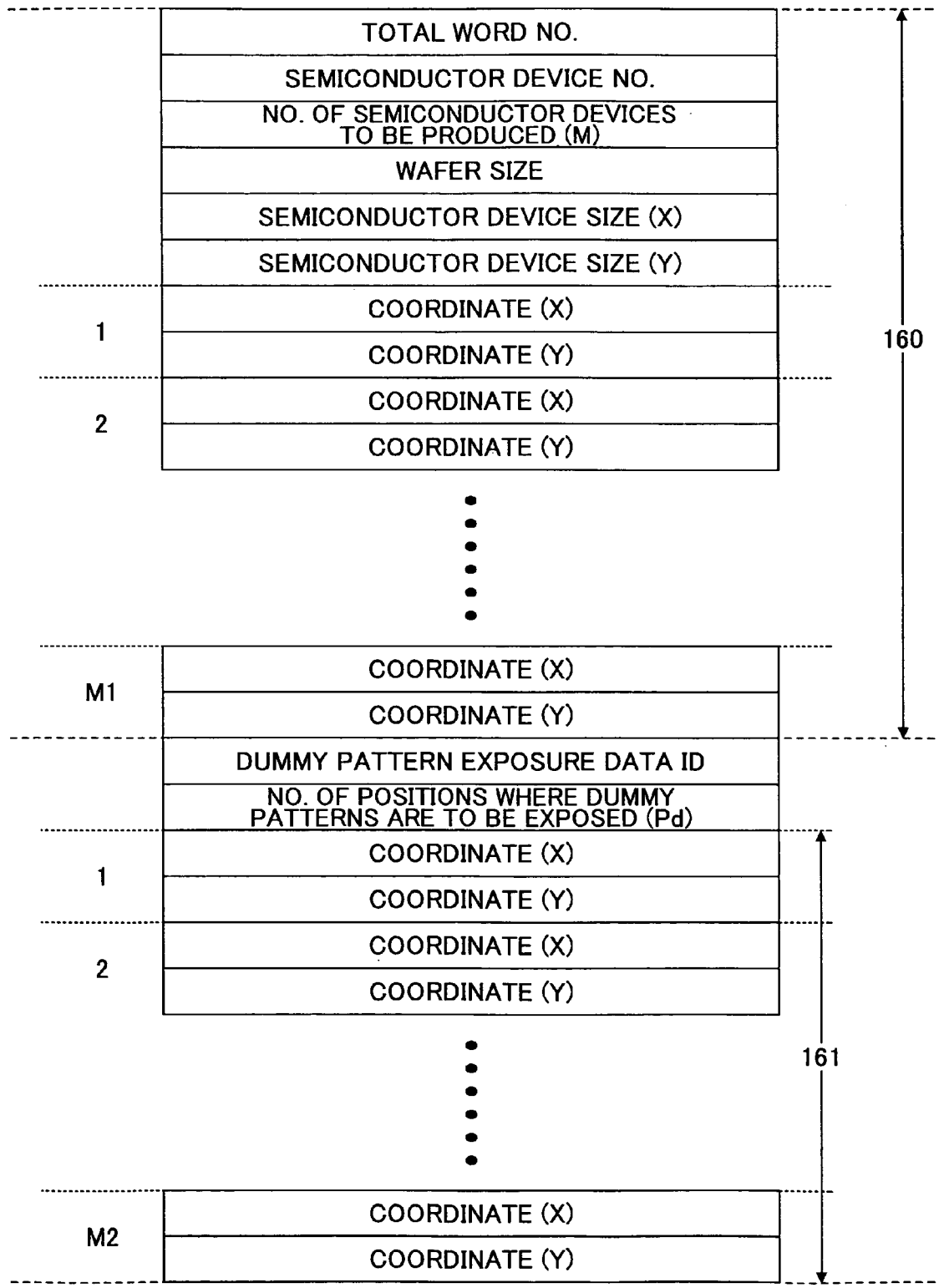
FIG. 21 is a diagram showing an example of a semiconductor device arrangement coordinate table.

FIG. 21 is a diagram showing an example of the semiconductor device arrangement coordinate table 503.

In FIG. 21, a portion 160 has the same contents as the corresponding portion of the semiconductor device arrangement coordinate table 501 shown in FIG. 12. The dummy pattern exposure data ID is described in the log file 77A, and is stored in the semiconductor device arrangement coordinate table 503 by referring to the log file 77A. The number Pd of positions where the dummy patterns are to be exposed is described in the log file 77A, and is stored in the semiconductor device arrangement coordinate table 503 by referring to the log file 77A. In a portion 161 of the semiconductor device arrangement coordinate table 503, the coordinates X and the coordinates Y indicate the positions where the dummy patterns are exposed on the wafer. The coordinates of the positions where the dummy patterns are arranged in the periphery of the semiconductor device group are extracted from the intermediate table 500 that is created by the step 81, and stored in the portion 161 of the semiconductor device arrangement coordinate table 503. The number of pairs of the coordinates X and Y amounts to the number Pd of positions where the dummy patterns are to be exposed.

The semiconductor layout file 84A is sent to the electron beam exposure apparatus via the Internet or the like.

Next, a description will be given of the effects of exposing the dummy patterns. For example, a metal layer is formed under a resist that is formed on the wafer. When etching such a metal wiring layer, a portion of the exposed resist is used as a protection layer to remove all of the layer other than the layer portion under the protection layer. When not exposing the patterns of the semiconductor devices at the arrangement positions including and subsequent to the arrangement position "10" shown in FIG. 16, for example, the area of the layer to be removed becomes extremely large. In the wafer process, the time (etching time) in which the etching is carried out is determined in advance, and in this particular case, not all of the unwanted layer portions may be removed within the determined etching time at the non-exposing patterns of the semiconductor devices at the arrangement positions including and subsequent to the arrangement position "10" in FIG. 16. In addition, since the etching is carried out using a gas, there is a possibility that the unwanted layer portions may not be sufficiently removed at the peripheral portions of the semiconductor devices that are produced and having the arrangement positions "2" through "9". Unless the unwanted layer portions are removed in their entirely at the peripheral portions of the semiconductor devices that are produced, when the wafer is thereafter diced into the individual semiconductor devices, the yield may deteriorate due to inconsistencies in the performance of the semiconductor devices caused by unwanted layer portions that are not sufficiently removed. However, when the dummy patterns are exposed, the unwanted layer portions are sufficiently removed even in the periphery of the semiconductor devices that are produced and have the arrangement positions "2" through "9", to thereby improve the yield of the semiconductor devices.

[Exposure Process]

The exposure process is carried out by inputting the exposure data of the exposure data file 56A and the semiconductor device layout file 84A to the electron beam exposure apparatus. The electron beam exposure apparatus having the structure shown in FIG. 1A or FIG. 1B may be used for the exposure process.

In each of the embodiments described above, it is assumed for the sake of convenience that the semiconductor devices that are created on the wafer are identical or, of the same kind (or type). However, it is of course possible to create different kinds (or types) of semiconductor devices on the wafer. In addition, the semiconductor devices that are produced to meet the time limit of delivery may be created on a single wafer or, created on a plurality of wafers depending on the required number of semiconductor devices. Moreover, the particular semiconductor devices that are created on the wafer are not limited to particular semiconductor devices.

This application claims the benefit of a Japanese Patent Application. No. 2006-080576 filed Mar. 23, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. A layout determination method for determining a layout of semiconductor devices that are to be created on a substrate by carrying out an exposure process, comprising:
   (a) determining a number of semiconductor devices to be created on one substrate using a computer, based on exposure data of the semiconductor devices, a time limit of delivery of the semiconductor devices and a number of substrates to be used for production of the semiconductor devices;
   (b) obtaining coordinates of semiconductor devices arrangeable on the substrate, based on the exposure data; and
   (c) determining the layout of the semiconductor devices to be created on the substrate, based on the exposure data, the number of semiconductor devices and the coordinates of the semiconductor devices,
   wherein said step (a) calculates the number of semiconductor devices to be created on one substrate, based on a time required for exposure per one semiconductor device, an exposure time per one layer of each semiconductor device, a total number of shots per one semiconductor device, and an exposure time per one shot.

2. The layout determination method as claimed in claim 1, wherein said step (c) arranges the semiconductor devices to be created on the substrate with priority starting from a central portion on the substrate.

3. The layout determination method as claimed in claim 1, wherein said step (c) arranges dummy patterns in a periphery of the semiconductor devices to be created on the substrate.

4. A layout determination method for determining a layout of semiconductor devices that are to be created on a substrate by carrying out an exposure process, comprising:
   (a) determining a number of semiconductor devices to be created on one substrate using a computer, based on exposure data of the semiconductor devices, a time limit of delivery of the semiconductor devices and a number of substrates to be used for production of the semiconductor devices;
   (b) obtaining coordinates of semiconductor devices arrangeable on the substrate, based on the exposure data; and
   (c) determining the layout of the semiconductor devices to be created on the substrate, based on the exposure data, the number of semiconductor devices and the coordinates of the semiconductor devices,
   wherein said step (a) calculates the number of semiconductor devices to be created on one substrate, based on a number of shots per one layer of each semiconductor device, a number of layers of each semiconductor device, a total number of shots per one semiconductor device, and a yield of the semiconductor devices.

5. The layout determination method as claimed in claim 4, wherein said step (c) arranges the semiconductor devices to be created on the substrate with priority starting from a central portion on the substrate.

6. The layout determination method as claimed in claim 4, wherein said step (c) arranges dummy patterns in a periphery of the semiconductor devices to be created on the substrate.

7. A method of manufacturing semiconductor devices, comprising:
   (a) determining a number of semiconductor devices to be created on one substrate using a computer, based on exposure data of semiconductor devices, time limit of delivery of the semiconductor devices and a number of substrates used for production of the semiconductor devices;
   (b) obtaining coordinates of semiconductor devices arrangeable on the substrate, based on the exposure data;
   (c) determining a layout of the semiconductor devices to be created on the substrate, based on the exposure data, the number of semiconductor devices and the coordinates of the semiconductor devices; and
   (d) exposing patterns of the exposure data on the substrate, based on the layout,
   wherein said step (a) calculates the number of semiconductor devices to be created on one substrate, based on a time required for exposure per one semiconductor device, an exposure time per one layer of each semiconductor device, a total number of shots per one semiconductor device, and an exposure time per one shot.

8. The method of manufacturing semiconductor devices as claimed in claim 7, wherein said step (c) arranges the semiconductor devices to be created on the substrate with priority starting from a central portion on the substrate.

9. The method of manufacturing semiconductor devices as claimed in claim 7, wherein said step (c) arranges dummy patterns in a periphery of the semiconductor devices to be created on the substrate.

10. A method of manufacturing semiconductor devices, comprising:
    (a) determining a number of semiconductor devices to be created on one substrate using a computer, based on exposure data of semiconductor devices, time limit of delivery of the semiconductor devices and a number of substrates used for production of the semiconductor devices;
    (b) obtaining coordinates of semiconductor devices arrangeable on the substrate, based on the exposure data;
    (c) determining a layout of the semiconductor devices to be created on the substrate, based on the exposure data, the number of semiconductor devices and the coordinates of the semiconductor devices; and
    (d) exposing patterns of the exposure data on the substrate, based on the layout,
    wherein said step (a) calculates the number of semiconductor devices to be created on one substrate, based on a number of shots per one layer of each semiconductor device, a number of layers of each semiconductor device, a total number of shots per one semiconductor device, and a yield of the semiconductor devices.

11. The method of manufacturing semiconductor devices as claimed in claim 10, wherein said step (c) arranges the semiconductor devices to be created on the substrate with priority starting from a central portion on the substrate.

12. The method of manufacturing semiconductor devices as claimed in claim 10, wherein said step (c) arranges dummy patterns in a periphery of the semiconductor devices to be created on the substrate.

13. A computer-readable program for causing a computer to determine a layout of semiconductor devices that are to be created on a substrate by carrying out an exposure process, said computer-readable program comprising:
- a number determining procedure causing the computer to determine a number of semiconductor devices to be created on one substrate, based on exposure data of the semiconductor devices, a time limit of delivery of the semiconductor devices and a number of substrates to be used for production of the semiconductor devices;
- an obtaining procedure causing the computer to obtain coordinates of semiconductor devices arrangeable on the substrate, based on the exposure data; and
- a layout determining procedure causing the computer to determine the layout of the semiconductor devices to be created on the substrate, based on the exposure data, the number of semiconductor devices and the coordinates of the semiconductor devices,
- wherein said number determining procedure causes the computer to calculate the number of semiconductor devices to be created on one substrate, based on a time required for exposure per one semiconductor device, an exposure time per one layer of each semiconductor device, a total number of shots per one semiconductor device, and an exposure time per one shot.

14. The computer-readable program as claimed in claim 13, wherein said layout determining procedure causes the computer to arrange the semiconductor devices to be created on the substrate with priority starting from a central portion on the substrate.

15. The computer-readable program as claimed in claim 13, wherein said layout determining procedure causes the computer to arrange dummy patterns in a periphery of the semiconductor devices to be created on the substrate.

16. A computer-readable program for causing a computer to determine a layout of semiconductor devices that are to be created on a substrate by carrying out an exposure process, said computer-readable program comprising:
- a number determining procedure causing the computer to determine a number of semiconductor devices to be created on one substrate, based on exposure data of the semiconductor devices, a time limit of delivery of the semiconductor devices and a number of substrates to be used for production of the semiconductor devices;
- an obtaining procedure causing the computer to obtain coordinates of semiconductor devices arrangeable on the substrate, based on the exposure data; and
- a layout determining procedure causing the computer to determine the layout of the semiconductor devices to be created on the substrate, based on the exposure data, the number of semiconductor devices and the coordinates of the semiconductor devices,
- wherein said number determining procedure causes the computer to calculate the number of semiconductor devices to be created on one substrate, based on a number of shots per one layer of each semiconductor device, a number of layers of each semiconductor device, a total number of shots per one semiconductor device, and a yield of the semiconductor devices.

17. The computer-readable program as claimed in claim 16, wherein said layout determining procedure causes the computer to arrange the semiconductor devices to be created on the substrate with priority starting from a central portion on the substrate.

18. The computer-readable program as claimed in claim 16, wherein said layout determining procedure causes the computer to arrange dummy patterns in a periphery of the semiconductor devices to be created on the substrate.

19. A computer-readable program for causing a computer to manufacture semiconductor devices, said computer-readable program comprising:
- a number determining procedure causing the computer to determine a number of semiconductor devices to be created on one substrate, based on exposure data of semiconductor devices, time limit of delivery of the semiconductor devices and a number of substrates used for production of the semiconductor devices;
- an obtaining procedure causing the computer to obtain coordinates of semiconductor devices arrangeable on the substrate, based on the exposure data;
- a layout determining procedure causing the computer to determine a layout of the semiconductor devices to be created on the substrate, based on the exposure data, the number of semiconductor devices and the coordinates of the semiconductor devices; and
- an exposing procedure causing the computer to expose patterns of the exposure data on the substrate, based on the layout
- wherein said number determining procedure causes the computer to calculate the number of semiconductor devices to be created on one substrate, based on a time required for exposure per one semiconductor device, an exposure time per one layer of each semiconductor device, a total number of shots per one semiconductor device, and an exposure time per one shot.

20. The computer-readable program as claimed in claim 19, wherein said layout determining procedure causes the computer to arrange the semiconductor devices to be created on the substrate with priority starting from a central portion on the substrate.

21. The computer-readable program as claimed in claim 19, wherein said layout determining procedure causes the computer to arrange dummy patterns in a periphery of the semiconductor devices to be created on the substrate.

22. A computer-readable program for causing a computer to manufacture semiconductor devices, said computer-readable program comprising:
- a number determining procedure causing the computer to determine a number of semiconductor devices to be created on one substrate, based on exposure data of semiconductor devices, time limit of delivery of the semiconductor devices and a number of substrates used for production of the semiconductor devices;
- an obtaining procedure causing the computer to obtain coordinates of semiconductor devices arrangeable on the substrate, based on the exposure data;
- a layout determining procedure causing the computer to determine a layout of the semiconductor devices to be created on the substrate, based on the exposure data, the number of semiconductor devices and the coordinates of the semiconductor devices; and
- an exposing procedure causing the computer to expose patterns of the exposure data on the substrate, based on the layout, wherein said number determining procedure causes the computer to calculate the number of semiconductor devices to be created on one substrate, based on a number of shots per one layer of each semiconductor device, a number of layers of each semiconductor device, a total number of shots per one semiconductor device, and a yield of the semiconductor devices.

23. The computer-readable program as claimed in claim 22, wherein said layout determining procedure causes the computer to arrange the semiconductor devices to be created on the substrate with priority starting from a central portion on the substrate.

24. The computer-readable program as claimed in claim 22, wherein said layout determining procedure causes the computer to arrange dummy patterns in a periphery of the semiconductor devices to be created on the substrate.

* * * * *

UNITED STATES PATENT AND TRADEMARK OFFICE
CERTIFICATE OF CORRECTION

PATENT NO.        : 7,587,703 B2
APPLICATION NO.   : 11/509617
DATED             : September 8, 2009
INVENTOR(S)       : Takita Hiroshi et al.

Page 1 of 1

It is certified that error appears in the above-identified patent and that said Letters Patent is hereby corrected as shown below:

First Page, Column 1 Item (54) (Title), Line 4, change "COMPUTER READABLE" to --COMPUTER-READABLE--.

Column 1, Line 4, change "COMPUTER READABLE" to --COMPUTER-READABLE--.

Column 20, Line 27, after "layout" insert --,--.

Signed and Sealed this

Twenty-ninth Day of December, 2009

David J. Kappos
*Director of the United States Patent and Trademark Office*